(12) United States Patent
Komatsu et al.

(10) Patent No.: US 8,859,404 B2
(45) Date of Patent: Oct. 14, 2014

(54) METHOD FOR FORMING MICROCRYSTALLINE SEMICONDUCTOR FILM AND METHOD FOR MANUFACTURING SEMICONDUCTOR DEVICE

(75) Inventors: Ryu Komatsu, Isehara (JP); Yasuhiro Jinbo, Atsugi (JP); Hidekazu Miyairi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 497 days.

(21) Appl. No.: 13/211,565

(22) Filed: Aug. 17, 2011

(65) Prior Publication Data

US 2012/0052637 A1    Mar. 1, 2012

(30) Foreign Application Priority Data

Aug. 25, 2010    (JP) .................................. 2010-188688

(51) Int. Cl.
*C23C 16/24* (2006.01)
*H01L 21/20* (2006.01)
*H01L 21/36* (2006.01)
*H01L 21/02* (2006.01)
*H01L 29/786* (2006.01)
*H01L 31/18* (2006.01)
*H01L 31/0368* (2006.01)
*H01L 29/04* (2006.01)
*H01L 29/66* (2006.01)

(52) U.S. Cl.
CPC ...... *H01L 21/02532* (2013.01); *H01L 21/0262* (2013.01); *H01L 29/78672* (2013.01); *H01L 31/1824* (2013.01); *H01L 31/03685* (2013.01); *H01L 21/02502* (2013.01); *H01L 21/0245* (2013.01); *H01L 29/78648* (2013.01); *H01L 29/78678* (2013.01); *H01L 29/04* (2013.01); *H01L 21/02488* (2013.01); *H01L 29/66765* (2013.01); *H01L 29/78696* (2013.01)
USPC ...................... 438/488; 438/485; 257/E21.09

(58) Field of Classification Search
CPC .................. H01L 31/03685; H01L 29/78672; H01L 31/1824
USPC .......................... 438/485, 488, 157, 158, 151; 257/E21.09
See application file for complete search history.

(56) References Cited

U.S. PATENT DOCUMENTS 4,409,134 A    10/1983    Yamazaki
5,453,858 A     9/1995    Yamazaki (Continued)

FOREIGN PATENT DOCUMENTS

EP    0535979 A    4/1993
JP    04-242724 A   8/1992

(Continued)

OTHER PUBLICATIONS

Arai.T et al., "41.2: Micro Silicon Technology for Active Matrix OLED Display,", SID Digest '07: SID International Symposium Digest of Technical Papers, 2007, vol. 38, pp. 1370-1373.

(Continued)

*Primary Examiner* — Jarrett Stark
(74) *Attorney, Agent, or Firm* — Eric J. Robinson; Robinson Intellectual Property Law Office, P.C.

(57) ABSTRACT

A seed crystal including mixed phase grains having high crystallinity at a low density is formed under a first condition over an insulating film, and then a first microcrystalline semiconductor film is formed over the seed crystal under a second condition that allows the mixed phase grains to grow and a space between the mixed phase grains to be filled. Then, a second microcrystalline semiconductor film is formed over the first microcrystalline semiconductor film under a third condition that allows formation of a microcrystalline semiconductor film having high crystallinity without increasing the space between the mixed phase grains included in the first microcrystalline semiconductor film.

20 Claims, 15 Drawing Sheets

(56) References Cited

U.S. PATENT DOCUMENTS

| | | |
|---|---|---|
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |
| 5,614,732 A | 3/1997 | Yamazaki |
| 5,648,293 A | 7/1997 | Hayama et al. |
| 5,677,236 A | 10/1997 | Saitoh et al. |
| 5,701,167 A | 12/1997 | Yamazaki |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |
| 6,153,893 A | 11/2000 | Inoue et al. |
| 6,252,249 B1 | 6/2001 | Yamazaki |
| 6,265,288 B1 | 7/2001 | Okamoto et al. |
| 6,271,055 B1 | 8/2001 | Yajima et al. |
| 6,281,520 B1 | 8/2001 | Yamazaki |
| 6,306,213 B1 | 10/2001 | Yamazaki |
| 6,344,420 B1 | 2/2002 | Miyajima et al. |
| 6,468,839 B2 | 10/2002 | Inoue et al. |
| 6,737,676 B2 | 5/2004 | Yamazaki |
| 6,855,621 B2 | 2/2005 | Kondo et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,551,655 B2 | 6/2009 | Tanaka et al. |
| 7,576,360 B2 | 8/2009 | Yamazaki |
| 7,833,845 B2 | 11/2010 | Yamazaki et al. |
| 8,410,486 B2 | 4/2013 | Tezuka et al. |
| 2009/0002591 A1 | 1/2009 | Yamazaki et al. |
| 2009/0033818 A1 | 2/2009 | Nakajima et al. |
| 2009/0047759 A1 | 2/2009 | Yamazaki et al. |
| 2009/0057683 A1 | 3/2009 | Nakajima et al. |
| 2009/0061574 A1 | 3/2009 | Nakajima et al. |
| 2009/0072237 A1 | 3/2009 | Yamazaki et al. |
| 2009/0130795 A1* | 5/2009 | Im .................................... 438/89 |
| 2010/0216285 A1 | 8/2010 | Yokoi et al. |
| 2011/0020989 A1 | 1/2011 | Tajima et al. |
| 2011/0039402 A1 | 2/2011 | Yamazaki et al. |
| 2011/0059562 A1 | 3/2011 | Yamazaki et al. |
| 2011/0278582 A1* | 11/2011 | Tezuka et al. .................... 257/66 |
| 2011/0318888 A1* | 12/2011 | Komatsu et al. ............. 438/157 |
| 2012/0021570 A1* | 1/2012 | Tajima et al. ................ 438/157 |
| 2012/0033156 A1* | 2/2012 | Yamazaki et al. .............. 349/62 |

FOREIGN PATENT DOCUMENTS

| | | |
|---|---|---|
| JP | 05-129608 A | 5/1993 |
| JP | 05-275346 A | 10/1993 |
| JP | 06-077483 A | 3/1994 |
| JP | 07-045833 A | 2/1995 |
| JP | 07-131030 A | 5/1995 |
| JP | 07-162003 A | 6/1995 |
| JP | 07-211708 A | 8/1995 |
| JP | 09-232235 A | 9/1997 |
| JP | 2000-174310 A | 6/2000 |
| JP | 2000-269201 A | 9/2000 |
| JP | 2000-277439 A | 10/2000 |
| JP | 2001-053283 A | 2/2001 |
| JP | 3201492 | 8/2001 |
| JP | 2002-206168 A | 7/2002 |
| JP | 2002-246605 A | 8/2002 |
| JP | 2002-280309 A | 9/2002 |
| JP | 2003-037278 A | 2/2003 |
| JP | 2004-200345 A | 7/2004 |
| JP | 2005-049832 A | 2/2005 |
| JP | 2005-167264 A | 6/2005 |
| JP | 2005-191546 A | 7/2005 |
| JP | 2006-237490 A | 9/2006 |
| JP | 2009-044134 A | 2/2009 |
| JP | 2009-076753 A | 4/2009 |
| JP | 2009-088501 A | 4/2009 |

OTHER PUBLICATIONS

Lee.C et al., "How to Achieve High Mobility Thin Film Transistors by Direct Deposition of Silicon Using 13.56 MHz RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Postdeposition Thermal Annealing and Material Stability of 75° C. Hydrogenated Nanocrystalline Silicon Plasma-Enhanced Chemical Vapor Deposition Films ,", J. Appl. Phys. (Journal of Applied Physics), Aug. 4, 2005, vol. 98, No. 3, pp. 034305-1-034305-7.

* cited by examiner

200nm

200nm

METHOD FOR FORMING MICROCRYSTALLINE SEMICONDUCTOR FILM AND METHOD FOR MANUFACTURING SEMICONDUCTOR DEVICE

BACKGROUND OF THE INVENTION

1. Field of the Invention

One embodiment of the present invention relates to a method for forming a microcrystalline semiconductor film, a method for manufacturing a semiconductor device including the microcrystalline semiconductor film, and a display device.

In this specification, a semiconductor device means all types of devices which can function by utilizing semiconductor characteristics, and a display device, an electro-optical device, a photoelectric conversion device, a semiconductor circuit, and an electronic device are all semiconductor devices.

2. Description of the Related Art

As one type of field-effect transistor, a thin film transistor whose channel region is formed in a semiconductor film which is formed over a substrate having an insulating surface is known. Techniques in which amorphous silicon, microcrystalline silicon, or polycrystalline silicon is used for the semiconductor film where the channel region is formed in the thin film transistor have been disclosed (see Patent Documents 1 to 5). A typical application of the thin film transistor is a liquid crystal television device, in which the thin film transistor is practically used as a switching transistor in each pixel in a display screen.

In addition, a photoelectric conversion device has been developed in which a microcrystalline silicon film, which is a film of crystalline silicon capable of being formed by a plasma CVD method, is used as a semiconductor film having a function of photoelectric conversion (for example, see Patent Document 6).

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546
[Patent Document 6] Japanese Published Patent Application No. 2000-277439

SUMMARY OF THE INVENTION

A thin film transistor whose channel region is formed using an amorphous silicon film has problems of low field-effect mobility and low on-state current. On the other hand, a thin film transistor whose channel region is formed using a microcrystalline silicon film has a problem in that, though the field-effect mobility is improved, the off-state current is high as compared to the thin film transistor whose channel region is formed using an amorphous silicon film and thus sufficient switching characteristics cannot be obtained.

A thin film transistor whose channel region is formed using a polycrystalline silicon film has a field-effect mobility much higher than and on-state current higher than those of the above two kinds of thin film transistors. These features enable this kind of thin film transistor to be used not only as a switching transistor in a pixel but also as an element of a driver circuit that needs to drive at high speed.

However, a manufacturing process of the thin film transistor whose channel region is formed using a polycrystalline silicon film involves a crystallization step for a semiconductor film and has a problem of higher manufacturing costs as compared to a manufacturing process of the thin film transistor whose channel region is formed using an amorphous silicon film. For example, a laser annealing technique necessary in the process for forming a polycrystalline silicon film prohibits efficient production of large-screen liquid crystal panels because the laser irradiation area is small.

The size of a glass substrate for manufacturing display panels has grown as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm).

However, a technique has not been established yet with which thin film transistors capable of high-speed operation can be manufactured with high productivity over a large-sized mother glass substrate such as the 10th generation (2950 mm×3400 mm) mother glass substrate, which is a problem in the industry.

An object of one embodiment of the present invention is to provide a method for manufacturing a semiconductor device which has excellent electrical characteristics with high productivity.

One embodiment of the present invention is a manufacturing method of a microcrystalline semiconductor film that includes forming a seed crystal that includes mixed phase grains with a space provided between the mixed phase grains over an insulating film, forming a first microcrystalline semiconductor film over the seed crystal, so that the mixed phase grains grow to fill the space provided between the mixed phase grains, and forming a second microcrystalline semiconductor film over the first microcrystalline semiconductor film so as not to increase the space provided between the mixed phase grains included in the first microcrystalline semiconductor film.

The first condition for forming high-crystallinity mixed phase grains at a low density is a condition in which a deposition gas containing silicon or germanium is diluted by setting the flow rate of hydrogen to more than or equal to 50 times and less than or equal to 1000 times that of the deposition gas and the pressure in a process chamber is higher than or equal to 67 Pa and lower than or equal to 13332 Pa. The second condition that allows the mixed phase grains to grow and the space between the mixed phase grains to be filled is a condition in which a deposition gas containing silicon or germanium is diluted by setting the flow rate of hydrogen to more than or equal to 100 times and less than or equal to 2000 times that of the deposition gas and the pressure in the process chamber is higher than or equal to 1333 Pa and lower than or equal to 13332 Pa. The third condition that allows formation of a microcrystalline semiconductor film having high crystallinity without increasing the space between the mixed phase grains included in the first microcrystalline semiconductor film is a condition in which hydrogen and a deposition gas containing silicon or germanium are supplied to the process chamber in a state of alternately increasing and decreasing the flow rate ratio of the deposition gas to hydrogen and the pressure in the process chamber is higher than or equal to 1333 Pa and lower than or equal to 13332 Pa.

Another embodiment of the present invention is a method in which a seed crystal which includes a mixed phase grain including an amorphous silicon region and a crystallite which is a microcrystal that can be regarded as a single crystal is formed by a plasma CVD method under a first condition, a first microcrystalline semiconductor film is formed over the seed crystal by a plasma CVD method under a second condition, and a second microcrystalline semiconductor film is formed over the first microcrystalline semiconductor film under a third condition. The first condition is a condition in which a deposition gas containing silicon or germanium and a gas containing hydrogen are used as source gas supplied to a process chamber, the deposition gas is diluted by setting the flow rate of hydrogen to more than or equal to 50 times and less than or equal to 1000 times that of the deposition gas, and the pressure in the process chamber is higher than or equal to 67 Pa and lower than or equal to 13332 Pa. The second condition is a condition in which a deposition gas containing silicon or germanium is diluted by setting the flow rate of hydrogen to more than or equal to 100 times and less than or equal to 2000 times that of the deposition gas and the pressure in the process chamber is higher than or equal to 1333 Pa and lower than or equal to 13332 Pa. Further, the third condition is a condition in which hydrogen and a deposition gas containing silicon or germanium are supplied to the process chamber in a state of alternately increasing and decreasing the flow rate of hydrogen and the pressure in the process chamber is higher than or equal to 1333 Pa and lower than or equal to 13332 Pa.

Note that the seed crystal may be in a state in which a plurality of mixed phase grains are dispersed or in a state in which a plurality of mixed phase grains are continuously provided (i.e. in a state of having a film shape) in some cases. It is preferable to determine the power for generating plasma as appropriate according to the flow rate ratio of hydrogen to the deposition gas containing silicon or germanium.

Further, in one embodiment of the present invention, a rare gas may be added to the source gas used in at least one of the first condition, the second condition, and the third condition.

Another embodiment of the present invention is a method for manufacturing a semiconductor device including a thin film transistor whose channel region is formed using a stack including the seed crystal, the first microcrystalline semiconductor film, and the second microcrystalline semiconductor film.

Another embodiment of the present invention is a method for manufacturing a photoelectric conversion device in which the stack including the seed crystal, the first microcrystalline semiconductor film, and the second microcrystalline semiconductor film is used as at least one of a semiconductor film having p-type conductivity, a semiconductor film having n-type conductivity, and a semiconductor film having a function of photoelectric conversion.

According to one embodiment of the present invention, a microcrystalline semiconductor film having high crystallinity can be formed. Further, a semiconductor device having favorable electrical characteristics can be manufactured with high productivity.

BRIEF DESCRIPTION OF THE DRAWINGS

In the accompanying drawings.

DETAILED DESCRIPTION OF THE INVENTION

Figure 1A:
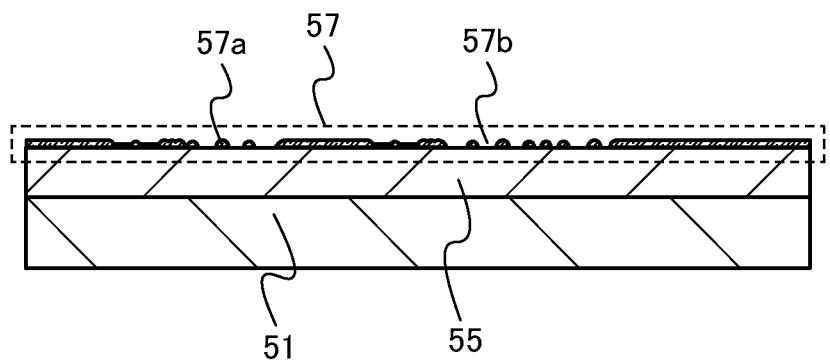
FIGS. 1A to 1C are cross-sectional views illustrating a method for forming a microcrystalline semiconductor film according to one embodiment of the present invention.

Hereinafter, embodiments and examples of the present invention will be described with reference to the drawings. Note that the present invention is not limited to the following description. It will be readily appreciated by those skilled in the art that the mode and details can be changed in various different ways without departing from the spirit and the scope of the present invention. Therefore, the present invention should not be construed as being limited to the following description of the embodiments and examples. Note that the same reference numerals are commonly used to denote the same components among different drawings.

Embodiment 1

In this embodiment, a method for forming a microcrystalline semiconductor film in which the crystallinity is improved by reduction of a space between mixed phase grains will be described with reference to FIGS. 1A to 1C and FIG. 2.

As illustrated in FIG. 1A, an insulating film 55 is formed over a substrate 51, and a seed crystal 57 is formed over the insulating film 55.

As the substrate 51, a glass substrate, a ceramic substrate, a plastic substrate which has heat resistance enough to withstand a process temperature of this manufacturing process, or the like can be used. In the case where the substrate does not need a light-transmitting property, a metal substrate, such as a stainless steel substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 51. For example, any of glass substrates of the 3rd to 10th generations which are often used in the field of the above flat panel displays can be used.

The insulating film 55 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film by a CVD method, a sputtering method, or the like.

Note that here, silicon oxynitride contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The seed crystal 57 is formed using a microcrystalline semiconductor film typified by a microcrystalline silicon film, a microcrystalline silicon germanium film, a microcrystalline germanium film, or the like. The seed crystal 57 may be in a state in which a plurality of mixed phase grains are dispersed, in which a plurality of mixed phase grains are continuously provided and form a film, or in which a plurality of mixed phase grains and an amorphous semiconductor are continuously provided and form a film. The seed crystal 57 may have a space 57b between adjacent mixed phase grains 57a without the mixed phase grains 57a being in contact with each other. Further, the seed crystal 57 includes the mixed phase grains having high crystallinity at a low grain density (a grain density is a existing proportion of the mixed phase grains in a plane). Note that the mixed phase grain includes an amorphous silicon region and a crystallite which is a microcrystal that can be regarded as a single crystal. In some cases, the mixed phase grain may include a twin crystal.

The seed crystal 57 is formed in a process chamber of a plasma CVD apparatus by glow discharge plasma using a mixture of hydrogen and a deposition gas containing silicon or germanium, under a first condition that allows the mixed phase grains having high crystallinity to be formed at a low grain density. Alternatively, the seed crystal 57 is formed by glow discharge plasma using a mixture of hydrogen, a deposition gas containing silicon or germanium, and a rare gas such as helium, neon, argon, krypton, or xenon. Here, a microcrystalline silicon film, a microcrystalline silicon germanium film, a microcrystalline germanium film, or the like is formed as the seed crystal 57 under the first condition where the flow rate of hydrogen is more than or equal to 50 times and less than or equal to 1000 times that of the deposition gas containing silicon or germanium so that the deposition gas is diluted, and the pressure in the process chamber is higher than or equal to 67 Pa and lower than or equal to 13332 Pa (higher than or equal to 0.5 Torr and lower than or equal to 100 Torr). The deposition temperature at this time is preferably room temperature to 350° C., further preferably 150° C. to 280° C. The distance between an upper electrode and a lower electrode is set to a distance that allows generation of plasma. With the first condition, crystal growth is promoted and the crystallinity of the mixed phase grain 57a in the seed crystal 57 is improved. That is, the size of the crystallite included in the mixed phase grain 57a in the seed crystal 57 is increased. Further, the space 57b is formed between the adjacent mixed phase grains 57a, which leads to a low grain density of the mixed phase grains 57a.

As typical examples of the deposition gas containing silicon or germanium, there are $SiH_4$, $Si_2H_6$, $GeH_4$, $Ge_2H_6$, and the like.

When a rare gas such as helium, neon, argon, krypton, or xenon is added to the source gas of the seed crystal 57, the deposition rate of the seed crystal 57 can be increased. As a result, the amount of impurities mixed in the seed crystal 57 can be reduced. Accordingly, the crystallinity of the seed crystal 57 can be improved. By using a rare gas such as helium, neon, argon, krypton, or xenon for the source gas of the seed crystal 57, stable plasma generation is possible without application of high power. Therefore, plasma damage to the seed crystal 57 can be reduced and the crystallinity of the mixed phase grains 57a can be improved.

When the seed crystal 57 is formed, glow discharge plasma is generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. Alternatively, glow discharge plasma is generated by application of high-frequency power with a microwave of 1 GHz or higher. Note that pulsed oscillation by which high-frequency power is applied in a pulsed manner or continuous oscillation by which high-frequency power is applied continuously can be employed. In addition, by superimposing high-frequency power in the HF band and high-frequency power in the VHF band on each other, unevenness of plasma across a large-sized substrate is also reduced, so that uniformity in film thickness and film quality can be increased and the deposition rate can be increased.

The flow rate of hydrogen is set higher than the flow rate of the deposition gas containing silicon or germanium as described above, whereby the amorphous semiconductor in the seed crystal 57 is etched while the seed crystal 57 is deposited; thus, the mixed phase grains 57a having high crystallinity can be formed and the space 57b can be formed between the adjacent mixed phase grains 57a. Optimal conditions differ according to an apparatus structure and a chemical state of a surface on which a film is to be formed: if the mixed phase grains 57a are hardly deposited, the flow rate ratio of hydrogen to the deposition gas containing silicon or germanium may be reduced or the RF electric power may be reduced; on the other hand, if the grain density of the mixed phase grains 57a is high or an amorphous semiconductor region is larger than a crystalline semiconductor region, the flow rate ratio of hydrogen to the deposition gas containing silicon or germanium may be increased or the RF electric power may be increased. The state of deposition of the seed crystal 57 can be evaluated by scanning electron microscopy (SEM) and Raman spectroscopy. By employing the above flow rate ratio and pressure in the process chamber, the seed crystal 57 can have favorable crystallinity and have a suitable space between the mixed phase grains 57a. Thus, the mixed phase grains 57a are formed while the amorphous semiconductor region in the seed crystal 57 is etched. Accordingly, crystal growth is promoted and the crystallinity of the mixed phase grains 57a is improved. That is, the size of the crystallites in the mixed phase grains 57a is increased. Further, since the amorphous semiconductor region is etched, the space 57b is formed between the mixed phase grains 57a; accordingly, the mixed phase grains 57a are formed at a low grain density. Note that when the seed crystal 57 is formed under the first condition of this embodiment, the grain sizes of the mixed phase grains 57a are uneven in some cases.

Note that before the seed crystal 57 is formed, a deposition gas containing silicon or germanium may be introduced into the process chamber of the CVD apparatus while the gas in the process chamber is removed so that impurity elements in the process chamber can be removed. Thus, the amount of impurities in the seed crystal 57 can be reduced. Further, the seed crystal 57 can be formed to be dense in such a manner that, before the seed crystal 57 is formed, plasma is generated in an atmosphere containing fluorine such as a fluorine atmosphere, a nitrogen fluoride atmosphere, or a silane fluoride atmosphere, and the insulating film 55 is exposed to the fluorine plasma.

Figure 1B:
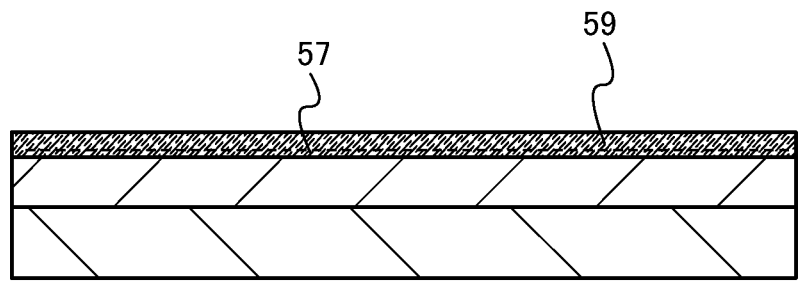

Then, as illustrated in FIG. 1B, a first microcrystalline semiconductor film 59 is formed over the seed crystal 57. The first microcrystalline semiconductor film 59 is formed under a condition that allows the mixed phase grains of the seed crystal 57 to grow so that the space between the mixed phase grains is filled.

The first microcrystalline semiconductor film 59 is formed under a second condition in a process chamber of the plasma CVD apparatus by glow discharge plasma using a mixture of hydrogen and a deposition gas containing silicon or germanium. Alternatively, the first microcrystalline semiconductor film 59 may be formed under a second condition by glow discharge plasma using a mixture of hydrogen, a rare gas such as helium, neon, argon, krypton, or xenon, and a deposition gas containing silicon or germanium. Here, the second condition is such a condition that the deposition gas containing silicon or germanium is diluted with hydrogen so that the flow rate of hydrogen is more than or equal to 100 times and less than or equal to 2000 times that of the deposition gas, and the pressure inside the process chamber is higher than or equal to 1333 Pa and lower than or equal to 13332 Pa (higher than or equal to 10 Torr and lower than or equal to 100 Torr).

As the first microcrystalline semiconductor film 59, a microcrystalline silicon film, a microcrystalline silicon germanium film, a microcrystalline germanium film, or the like is formed under the above second condition. Therefore, in the first microcrystalline semiconductor film 59, the ratio of the crystal regions to the amorphous semiconductor is increased and the space between the crystal regions is reduced, whereby the crystallinity is improved. The deposition temperature at this time is preferably room temperature to 350° C., further preferably 150° C. to 280° C. The distance between an upper electrode and a lower electrode is set to a distance that allows generation of plasma.

As a source gas of the first microcrystalline semiconductor film 59, a rare gas such as helium, neon, argon, krypton, or xenon may be used.

The condition for generating glow discharge plasma in the formation of the seed crystal 57 can be employed as appropriate for the formation of the first microcrystalline semiconductor film 59. In the case where the condition for generating glow discharge plasma in the formation of the seed crystal 57 and that in the formation of the first microcrystalline semiconductor film 59 are the same, throughput can be increased. However, the conditions may be different from each other.

The first microcrystalline semiconductor film 59 is formed under the second condition where the space 57b between the mixed phase grains 57a in the seed crystal 57 is filled and the crystal growth is promoted. Typically, in the second condition, the flow rate of hydrogen is more than or equal to 100 times and less than or equal to 2000 times that of the deposition gas containing silicon or germanium so that the deposition gas is diluted, and the pressure in the process chamber is higher than or equal to 1333 Pa and lower than or equal to 13332 Pa (higher than or equal to 10 Torr and lower than or equal to 100 Torr). In the above condition, since the pressure in the process chamber is high, the mean free path is short and the energy of plasma ions is reduced, which leads to improvement of the coverage with the first microcrystalline semiconductor film 59 and reduction in ion damage to the first microcrystalline semiconductor film 59; accordingly, defects can be reduced. Further, in the above condition, since the dilution ratio of the deposition gas containing silicon or germanium is high and the amount of generated hydrogen radicals is increased, the crystal grows using the crystallite in the mixed phase grain 57a as a nucleus while the amorphous semiconductor region is etched. As a result, in the first microcrystalline semiconductor film 59, the ratio of the crystal regions to the amorphous semiconductor region is increased and the crystallinity is improved. Further, defects caused in the first microcrystalline semiconductor film 59 during the deposition are reduced.

When mixed phase grains of the first microcrystalline semiconductor film 59 are newly generated in the space 57b between the mixed phase grains 57a of the seed crystal 57, the size of the mixed phase grains of the first microcrystalline semiconductor film 59 is smaller. Therefore, it is preferable that the frequency of generation of the mixed phase grains of the first microcrystalline semiconductor film 59 be lower than that of the mixed phase grains 57a of the seed crystal 57. In this manner, using the crystallite included in the mixed phase grain 57a of the seed crystal 57 as a nucleus, crystal growth from the seed crystal 57 can be promoted primarily.

Crystal growth of the first microcrystalline semiconductor film 59 occurs using the crystallite in the mixed phase grain 57a of the seed crystal 57 as a nucleus. Further, the size of the mixed phase grain of the first microcrystalline semiconductor film 59 depends on the space between the mixed phase grains 57a of the seed crystal 57. Therefore, when the grain density of the mixed phase grains 57a of the seed crystal 57 is low, the space between the mixed phase grains 57a is large; thus, the crystal growth distance of the mixed phase grains of the first microcrystalline semiconductor film 59 can be increased and the size of the mixed phase grains in the first microcrystalline semiconductor film 59 can be increased.

Figure 1C:
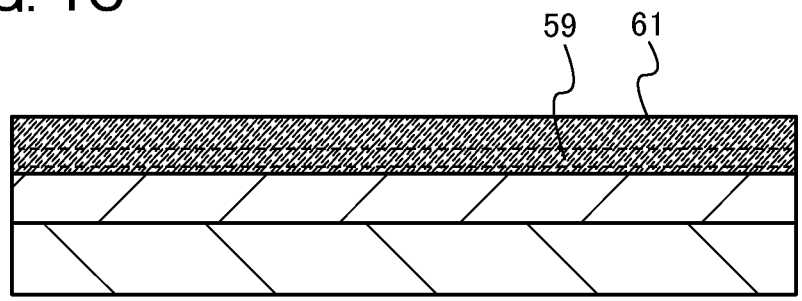

Next, as illustrated in FIG. 1C, a second microcrystalline semiconductor film 61 is formed over the first microcrystalline semiconductor film 59. The second microcrystalline semiconductor film 61 is formed under a condition that allows a microcrystalline semiconductor film having high crystallinity to be formed without increasing the space between the mixed phase grains included in the first microcrystalline semiconductor film.

The second microcrystalline silicon film 61 is formed under a third condition in a process chamber of the plasma CVD apparatus by glow discharge plasma using a mixture of hydrogen and a deposition gas containing silicon or germanium. Alternatively, the second microcrystalline silicon film 61 is formed under a third condition by glow discharge plasma using a mixture of a deposition gas containing silicon or germanium, hydrogen, and a rare gas such as helium, neon, argon, krypton, or xenon. Here, the third condition is a condition in which the flow rate ratio of the deposition gas containing silicon or germanium to hydrogen is alternately increased and decreased at the time of supply of the deposition gas containing silicon or germanium and hydrogen to the process chamber and in which the pressure in the process chamber is higher than or equal to 1333 Pa and lower than or equal to 13332 Pa.

"Alternately increasing and decreasing the flow rate ratio of the deposition gas containing silicon or germanium to hydrogen" refers to increasing and decreasing the flow rate of the deposition gas containing silicon or germanium or the flow rate of hydrogen. In the case where the flow rate ratio of hydrogen to the deposition gas containing silicon or germanium is low, typically, in the case where the flow rate of hydrogen is more than or equal to 100 times and less than or equal to 2000 times that of the deposition gas, crystal growth of the microcrystalline semiconductor is primarily performed. On the other hand, in the case where the flow rate ratio of hydrogen to the deposition gas containing silicon or germanium is high, etching of the amorphous semiconductor is primarily performed. Note that the flow rate ratio of hydrogen to the deposition gas containing silicon or germanium may be increased and decreased periodically.

As the second microcrystalline semiconductor film 61, a microcrystalline silicon film, a microcrystalline silicon germanium film, a microcrystalline germanium film, or the like is formed under the above third condition. Therefore, in the second microcrystalline semiconductor film 61, the space between the mixed phase grains of the first microcrystalline semiconductor film 59 is not increased and the crystallinity is improved. The deposition temperature at this time is preferably room temperature to 350° C., further preferably 150° C. to 280° C. The distance between an upper electrode and a lower electrode is set to a distance that allows generation of plasma.

As a source gas of the second microcrystalline semiconductor film 61, a rare gas such as helium, neon, argon, krypton, or xenon may be used.

The condition for generating glow discharge plasma in the formation of the seed crystal 57 can be employed as appropriate for the formation of the second microcrystalline semiconductor film 61. In the case where the condition for generating glow discharge plasma in the formation of the seed crystal 57, that in the formation of the first microcrystalline semiconductor film 59, and that in the formation of the second microcrystalline semiconductor film 61 are the same, throughput can be increased. However, the conditions may be different from each other.

Figure 2:
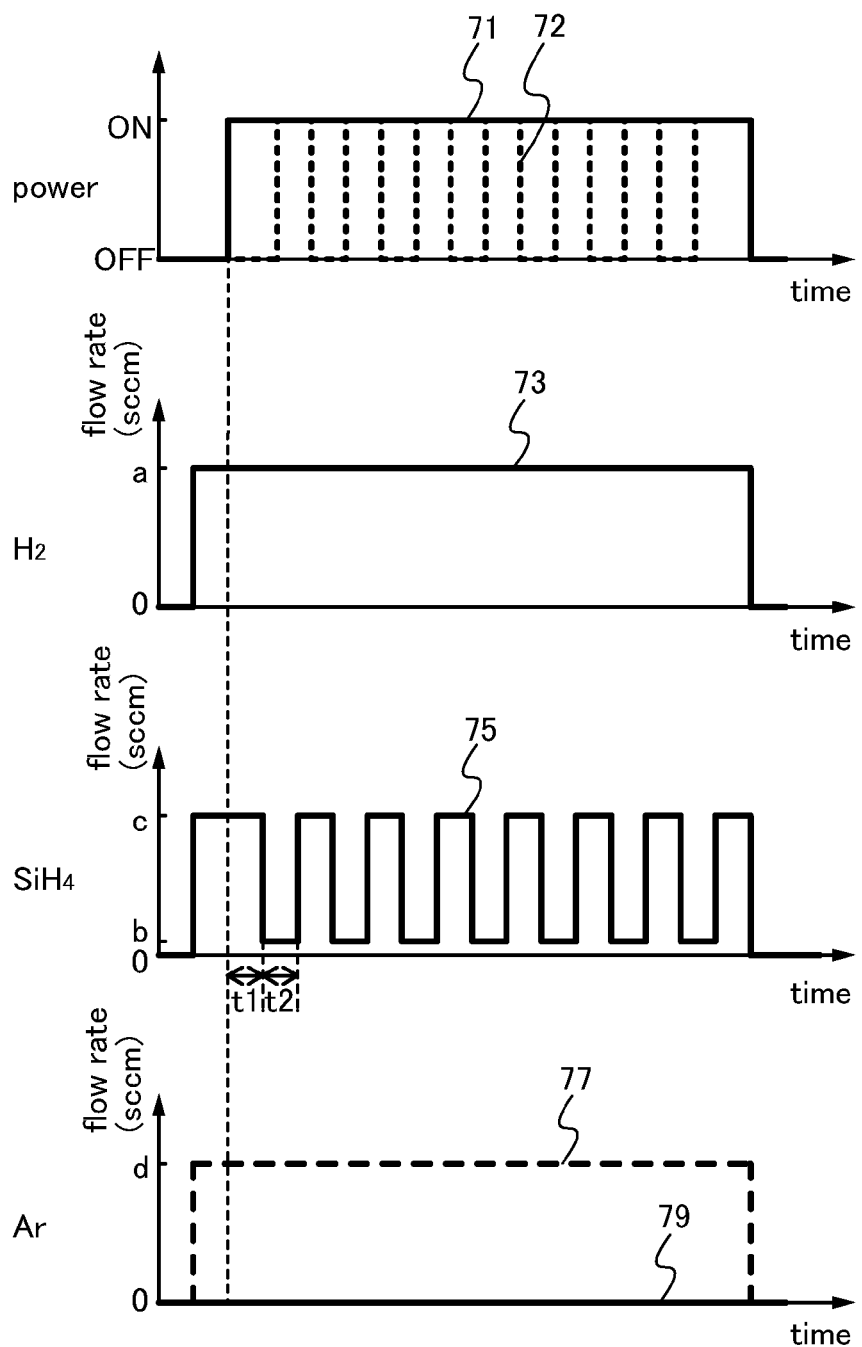
FIG. 2 is a flow chart of a method for forming a microcrystalline semiconductor film according to one embodiment of the present invention.

Here, a method for alternately increasing and decreasing the flow rate ratio of the deposition gas containing silicon or germanium to hydrogen will be described with reference to FIG. 2. FIG. 2 shows timing charts showing temporal changes of the flow rates of source gas in a method for forming the second microcrystalline semiconductor film 61 described in this embodiment. In FIG. 2, a solid line 71 indicates on/off states of power supply of the plasma CVD apparatus, a solid line 73 indicates the flow rate of hydrogen, a solid line 75 indicates the flow rate of the deposition gas containing silicon or germanium (silane is used in FIG. 2), and a solid line 79 indicates the flow rate of a rare gas (argon is used in FIG. 2).

The deposition gas containing silicon or germanium, which is a source gas, and hydrogen are introduced into the process chamber of the plasma CVD apparatus and the pressure therein is set at a predetermined level. The temperature of the substrate 51 is set at a predetermined temperature. At this time, hydrogen is supplied into the process chamber with a fixed flow rate (flow rate a in FIG. 2).

Next, high-frequency power supply is turned on, and plasma discharge is performed. The deposition gas containing silicon or germanium whose flow rate is alternately increased and decreased is supplied into the process chamber. Here, alternately increasing and decreasing the flow rate ratio of the deposition gas containing silicon or germanium to hydrogen is called cycle flow. In this embodiment, after the power supply is turned on, a first period in which the deposition gas containing silicon or germanium with a flow rate c is supplied for $t_1$ seconds and a second period in which the deposition gas containing silicon or germanium with a flow rate b ($0<b<c$) is supplied for $t_2$ seconds are repeated. Note that the flow rate of the deposition gas containing silicon or germanium in the second period is lower than that in the first period, so that the flow rate ratio of hydrogen to the deposition gas containing silicon or germanium in the second period is higher than that in the first period. In the first period, in the case where the flow rate of hydrogen is made more than or equal to 100 times and less than or equal to 2000 times that of the deposition gas, crystal growth of the microcrystalline semiconductor is primarily performed by plasma discharge performed later. In the second period, in the case where the flow rate of hydrogen is made more than or equal to 100 times and less than or equal to 2000 times that of the deposition gas, etching of the amorphous semiconductor is preferentially performed.

Radicals are generated from the deposition gas containing silicon or germanium along with hydrogen radicals in plasma. When the pressure in the process chamber is set higher than or equal to 1333 Pa and lower than or equal to 13332 Pa (higher than or equal to 10 Torr and lower than or equal to 100 Torr), the mean free path is short because of such high pressure in the process chamber; thus, hydrogen radicals and hydrogen ions lost energy every time they collide with each other. Accordingly, the energy of hydrogen radicals and hydrogen ions when they reach the first microcrystalline semiconductor film 59 is low. Therefore, in a surface of the first microcrystalline semiconductor film 59, not the etching but the crystal growth is primarily promoted, and a microcrystalline semiconductor is deposited; thus, the second microcrystalline semiconductor film 61 in which the crystallinity is high can be formed without increasing the space between the mixed phase grains in the first microcrystalline semiconductor film. When the pressure in the process chamber is set to the above-described level, the energy of the ions becomes low, so that ion damage to the second microcrystalline semiconductor film 61 during the deposition is reduced. Thus, defects are reduced.

In the first period in which the flow rate of the deposition gas containing silicon or germanium is high (the period with the flow rate c in FIG. 2), a large number of radicals are generated from the deposition gas containing silicon or germanium as compared to the second period with the flow rate b, so that the crystal growth occurs. The microcrystalline semiconductor film includes a plurality of mixed phase grains, and the size of the crystallites in the mixed phase grains can be increased by the method for forming the second microcrystalline semiconductor film 61, which is described in this embodiment; thus, the crystallinity of the second microcrystalline semiconductor film 61 can be improved. Further, defects of the second microcrystalline semiconductor film 61 are reduced.

In the second period in which the flow rate of the deposition gas containing silicon or germanium is low (the period with the flow rate b in FIG. 2), when the pressure in the process chamber is set higher than or equal to 1333 Pa and lower than or equal to 13332 Pa (higher than or equal to 10 Torr and lower than or equal to 100 Torr), the amorphous semiconductor in the first microcrystalline semiconductor film 59 which is formed under the second condition is selectively etched by hydrogen radicals dissociated in plasma because of such high pressure in the process chamber. Note that the radicals (typically, silyl radicals) are slightly generated from the deposition gas containing silicon or germanium, and are bonded to dangling bonds of the microcrystalline semiconductor on the deposition surface; thus, crystals with high crystallinity grow. That is, crystal growth occurs concurrently with the etching, whereby the crystallinity of the second microcrystalline semiconductor film 61 is increased.

Note that here, after the first period in which the deposition gas containing silicon or germanium flows with the flow rate c, the second period in which the deposition gas containing silicon or germanium flows with the flow rate b follows; however, after the second period in which the deposition gas containing silicon or germanium flows with the flow rate b, the first period in which the deposition gas containing silicon or germanium flows with the flow rate c may follow. Further, the length of $t_1$ and that of $t_2$ may be the same as or different from each other. Note that $t_1$ and $t_2$ are each preferably several seconds to several tens of seconds. When $t_1$ and $t_2$ are each several minutes, for example, a microcrystalline semiconductor film having low crystallinity with several nanometers thickness is formed in $t_1$, and only a surface of the microcrystalline semiconductor film is reacted in $t_2$. Accordingly, it is difficult to increase the crystallinity inside the microcrystalline semiconductor film.

Note that here, each of all the first periods, i.e., each of all periods in which the deposition gas containing silicon or germanium flows with the flow rate c, takes $t_1$ seconds; however, they may take different times. Further, here, each of all the second periods, i.e., each of all periods in which the deposition gas containing silicon or germanium flows with the flow rate b (b<c), takes $t_2$ seconds; however, they may take different times.

Further, as shown by the solid line 79 in FIG. 2, other than the above-described source gas, a rare gas such as helium, neon, argon, krypton, or xenon is not introduced. However, as shown by a dashed line 77, such a rare gas may be introduced into the process chamber. Alternatively, a rare gas whose flow rate is alternately increased and decreased may be introduced into the process chamber.

Note that although the flow rate of hydrogen is fixed here, the flow rate may be changed as needed to form the second microcrystalline semiconductor film 61. Alternatively, the flow rate of the deposition gas containing silicon or germanium may be fixed and the flow rate of hydrogen may be alternately increased and decreased.

By changing the flow rate of the source gas while the high-frequency power supply is kept on, the deposition rate of the second microcrystalline semiconductor film 61 can be improved.

Note that after the deposition gas containing silicon or germanium is introduced into the process chamber with the flow rate c, that is, after the first period, the high-frequency power supply may be turned off. Alternatively, after the deposition gas containing silicon or germanium is introduced into the process chamber with the flow rate b, that is, after the second period, the high-frequency power supply may be turned off.

Here, the flow rate b of the deposition gas containing silicon or germanium has the relation: 0<b<c. However, the flow rate b may be 0. That is, the period in which the deposition gas containing silicon or germanium is introduced and the period in which the deposition gas containing silicon or germanium is not introduced may be alternately provided. Note that the high-frequency power supply may be turned on and off repeatedly as shown by a dashed line 72.

Through the above process, the second microcrystalline semiconductor film 61 having high crystallinity can be formed.

Note that the pressure of the second condition may be higher than that of the first condition. Alternatively, the pressure of the first condition may be higher than that of the second condition. Further alternatively, the pressure of the first condition may be equal to that of the second condition.

The thickness of the seed crystal 57 is preferably greater than or equal to 1 nm and less than or equal to 10 nm. If the thickness of the seed crystal 57 is greater than 10 nm, even when the first microcrystalline semiconductor film 59 is deposited, it is difficult to fill the space between the mixed phase grains 57a and to etch the amorphous semiconductor in the seed crystal 57, which reduces the crystallinity of the seed crystal 57 and the first microcrystalline semiconductor film 59. In addition, since the mixed phase grain needs to be formed in the seed crystal 57, the thickness of the seed crystal 57 is preferably greater than or equal to 1 nm.

The total thickness of the first microcrystalline semiconductor film 59 and the second microcrystalline semiconductor film 61 is preferably greater than or equal to 30 nm and less than or equal to 100 nm. When the total thickness of the first microcrystalline semiconductor film 59 and the second microcrystalline semiconductor film 61 is 30 nm or more, variation in electrical characteristics of thin film transistors can be reduced; and when the total thickness of the first microcrystalline semiconductor film 59 and the second microcrystalline semiconductor film 61 is 100 nm or less, throughput can be increased and film peeling due to stress can be suppressed.

The seed crystal 57, the first microcrystalline semiconductor film 59, and the second microcrystalline semiconductor film 61 include a microcrystalline semiconductor. Note that a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like mixed phase grains having a diameter greater than or equal to 2 nm and less than or equal to 200 nm, preferably greater than or equal to 10 nm and less than or equal to 80 nm, further preferably greater than or equal to 20 nm and less than or equal to 50 nm grow in a direction normal to the substrate surface. Therefore, there is a case in which a crystal grain boundary is formed at the interface between the columnar or needle-like mixed phase grains. Note that the diameter of crystal grains means the maximum diameter of crystal grains in a plane parallel to the substrate surface.

The Raman spectrum of microcrystalline silicon, which is a typical example of a microcrystalline semiconductor, is located in a lower wave number side than 520 $cm^{-1}$, which represents single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon includes hydrogen or halogen at 1 atomic % or more in order to terminate dangling bonds. Moreover, microcrystalline silicon has increased stability and is preferable when containing a rare gas element such as helium, neon, argon, krypton, or xenon to further enhance lattice distortion. Such a description of the microcrystalline semiconductor is disclosed in, for example, U.S. Pat. No. 4,409,134.

According to this embodiment, a microcrystalline semiconductor film having high crystallinity by reduction of a space between mixed phase grains can be formed.

Embodiment 2

In this embodiment, a method for manufacturing a thin film transistor formed in a semiconductor device that is one embodiment of the present invention will be described with reference to FIGS. 3A to 3E, FIGS. 4A and 4B, FIGS. 5A to 5C, and FIGS. 6A to 6D. Note that an n-channel thin film transistor has higher carrier mobility than a p-channel thin film transistor. Further, it is preferable that all thin film transistors formed over the same substrate have the same polarity because the number of manufacturing steps can be reduced in such a case. In this embodiment, a method for manufacturing n-channel thin film transistors will be described.

Note that the term "on-state current" refers to current which flows between a source electrode and a drain electrode when a thin film transistor is on. For example, in the case of an n-channel thin film transistor, the on-state current refers to current which flows between a source electrode and a drain electrode when gate voltage is higher than the threshold voltage of the transistor.

In addition, the term "off-state current" refers to current which flows between a source electrode and a drain electrode when a thin film transistor is off. For example, in the case of an n-channel thin film transistor, the off-state current refers to current which flows between a source electrode and a drain electrode when gate voltage is lower than the threshold voltage of the thin film transistor.

Figure 3A:
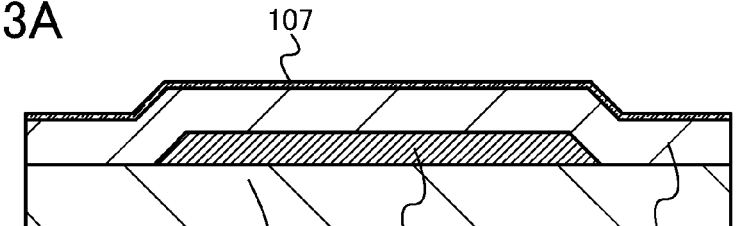
FIGS. 3A to 3E are cross-sectional views illustrating a method for manufacturing a semiconductor device according to one embodiment of the present invention.

As illustrated in FIG. 3A, a gate electrode 103 is formed over a substrate 101. Then, a gate insulating film 105 which covers the gate electrode 103 (also referred to as a first gate electrode) is formed. A seed crystal 107 is formed over the gate insulating film 105.

As the substrate 101, any of the substrates that can be used as the substrate 51 described in Embodiment 1 can be used as appropriate.

The gate electrode 103 can be formed as a single layer or a stacked layer using a metal such as molybdenum, titanium, chromium, tantalum, tungsten, aluminum, copper, neodymium, scandium, or nickel or an alloy which includes any of these materials as a main component. Further, a semiconductor typified by polycrystalline silicon doped with an impurity element such as phosphorus, an Ag—Pd—Cu alloy, an Al—Nd alloy, an Al—Ni alloy, or the like may be used.

The following are preferable examples of the two-layer structure of the gate electrode 103: a two-layer structure in which a molybdenum film is provided over an aluminum film, a two-layer structure in which a molybdenum film is provided over a copper film, a two-layer structure in which a titanium nitride film or a tantalum nitride film is provided over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film serving as a barrier film over a film having low electric resistance, electric resistance can be low and diffusion of metal elements from the metal film into the semiconductor film can be prevented.

The gate electrode 103 can be formed in the following manner: a conductive film is formed over the substrate 101 by a sputtering method or a vacuum evaporation method using any of the above materials; a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a nitride film of any of the above metal materials may be provided between the substrate 101 and the gate electrode 103. In this embodiment, a conductive film is formed over the substrate 101 and etched using a resist mask formed by a photolithography method.

Note that a side surface of the gate electrode 103 preferably has a tapered shape. This is because an insulating film, a semiconductor film, and a wiring formed over the gate electrode 103 in later steps can be prevented from being cut at a step portion of the gate electrode 103. In order to form the gate electrode 103 to have a tapered shape, etching may be performed while the resist mask is made to recede.

In the step of forming the gate electrode 103, a gate wiring (a scan line) and a capacitor wiring can also be formed at the same time. The scan line refers to a wiring for selecting a pixel, and the capacitor wiring refers to a wiring which is connected to one of electrodes of a storage capacitor in a pixel. However, without limitation thereto, the gate electrode 103 and one of or both the gate wiring and the capacitor wiring may be formed separately.

The gate insulating film (also referred to as a first gate insulating film) 105 can be formed using any of the insulating films that can be used as the insulating film 55 described in Embodiment 1 as appropriate. By forming the gate insulating film 105 using an oxide insulating film such as a silicon oxide film or a silicon oxynitride film, change in threshold voltage of the thin film transistor can be reduced.

The gate insulating film 105 can be formed by a CVD method, a sputtering method, or the like. The condition for the deposition of the seed crystal 57 which is described in Embodiment 1 can be employed as appropriate to generate the glow discharge plasma in the step of forming the gate insulating film 105 by a CVD method. When the gate insulating film 105 is formed at a high frequency of 1 GHz or more with a microwave plasma CVD apparatus, the breakdown voltage between the gate electrode and the drain and source electrodes can be improved, whereby a highly reliable thin film transistor can be obtained.

Further, by forming a silicon oxide film by a CVD method using an organosilane gas as the gate insulating film 105, the crystallinity of the semiconductor film which is formed later can be increased, whereby the on-state current and the field-effect mobility of the thin film transistor can be increased. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The seed crystal 107 can be formed under a first condition that allows the density of mixed phase grains to be low and the crystallinity of the mixed phase grains to be high, in a manner similar to that of the seed crystal 57 described in Embodiment 1.

In the case where a rare gas such as helium, neon, argon, krypton, or xenon is added to the source gas of the seed crystal 107, the crystallinity of the seed crystal 107 can be increased. Accordingly, the on-state current and the field-effect mobility of the thin film transistor can be increased and the throughput of the thin film transistor can also be increased.

Figure 3B:
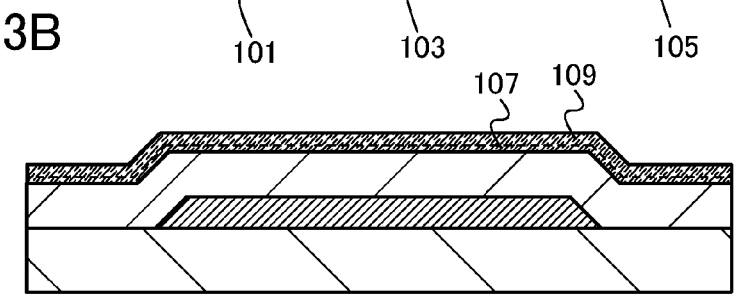

Then, as illustrated in FIG. 3B, a first microcrystalline semiconductor film 109 is formed over the seed crystal 107. In a manner similarly to that of the first microcrystalline semiconductor film 59 described in Embodiment 1, the first microcrystalline semiconductor film 109 can be formed under the second condition that allows crystal growth of the mixed phase grains in the seed crystal 107 so that a space between the mixed phase grains is filled.

In the case where a rare gas such as helium, neon, argon, krypton, or xenon is added to the source gas of the first microcrystalline semiconductor film 109, the crystallinity of the first microcrystalline semiconductor film 109 can be improved as in the case of the seed crystal 107. Accordingly, the on-state current and the field-effect mobility of the thin film transistor can be increased and the throughput of the thin film transistor can also be increased.

Figure 3C:
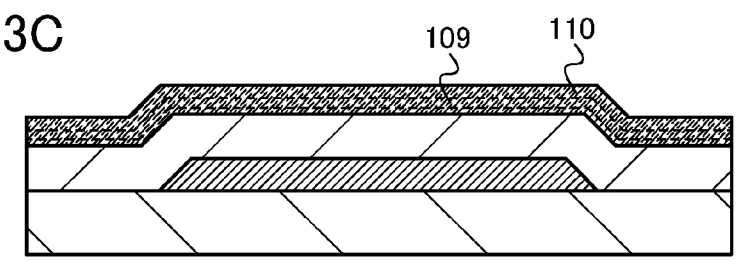

Next, as illustrated in FIG. 3C, a second microcrystalline semiconductor film 110 is formed over the first microcrystalline semiconductor film 109. The second microcrystalline semiconductor film 110 can be formed under the third condition that allows a microcrystalline semiconductor film having high crystallinity to be formed without increasing the space between the mixed phase grains included in the first microcrystalline semiconductor film 109, in a manner similar to that of the second microcrystalline semiconductor film 61 described in Embodiment 1.

Figure 3D:
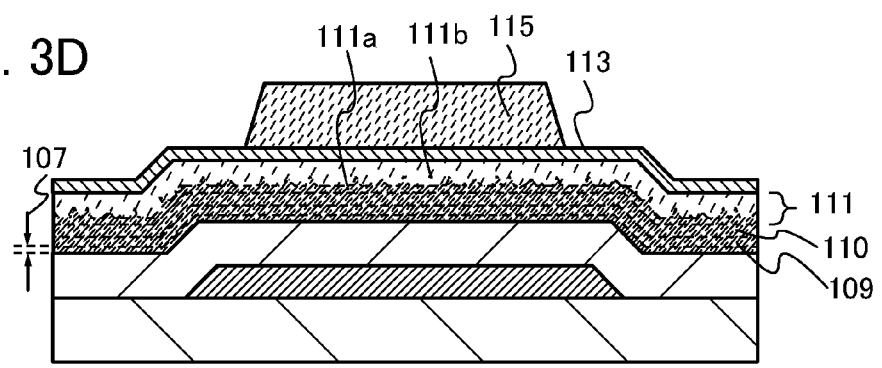

Then, as illustrated in FIG. 3D, a semiconductor film 111 is formed over the second microcrystalline semiconductor film 110. The semiconductor film 111 includes a microcrystalline semiconductor region 111a and an amorphous semiconductor region 111b. Then, an impurity semiconductor film 113 is formed over the semiconductor film 111. Then, a mask 115 is formed of a resist over the impurity semiconductor film 113.

The semiconductor film 111 including the microcrystalline semiconductor region 111a and the amorphous semiconductor region 111b can be formed under a condition which causes partial crystal growth using the second microcrystalline semiconductor film 110 as a nucleus (a condition under which the crystal growth is suppressed).

The semiconductor film 111 is formed in a process chamber of a plasma CVD apparatus by glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the seed crystal 107.

In this case, the flow rate ratio of hydrogen and the deposition gas containing silicon or germanium is set so as to allow the formation of a microcrystalline semiconductor film as in the case of the seed crystal 107, the first microcrystalline semiconductor film 109, or the second microcrystalline semiconductor film 110, and a gas containing nitrogen is used as a source gas, whereby crystal growth can be suppressed as compared to the deposition conditions for the seed crystal 107, the first microcrystalline semiconductor film 109, and the second microcrystalline semiconductor film 110. Specifically, since a gas containing nitrogen is included in the source gas, the crystal growth is partly suppressed at an early stage of the deposition of the semiconductor film 111; thus, a conical or pyramidal microcrystalline semiconductor region grows, and an amorphous semiconductor region is formed. Furthermore, at a middle stage or later stage of the deposition, the crystal growth of the conical or pyramidal microcrystalline semiconductor region stops, and only the amorphous semiconductor region is deposited. As a result, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

Here, a typical example of a condition for forming the semiconductor film 111 is a condition in which the flow rate of hydrogen is 10 times to 2000 times, preferably 10 times to 200 times that of the deposition gas containing silicon or germanium. Note that in a typical example of a condition for forming an amorphous semiconductor film, the flow rate of hydrogen is 0 times to 5 times that of the deposition gas containing silicon or germanium.

By introducing a rare gas such as helium, neon, argon, krypton, or xenon into a source gas of the semiconductor film 111, the deposition rate can be increased.

The thickness of the semiconductor film 111 is preferably 50 nm to 350 nm, further preferably 120 nm to 250 nm.

Figure 4A:
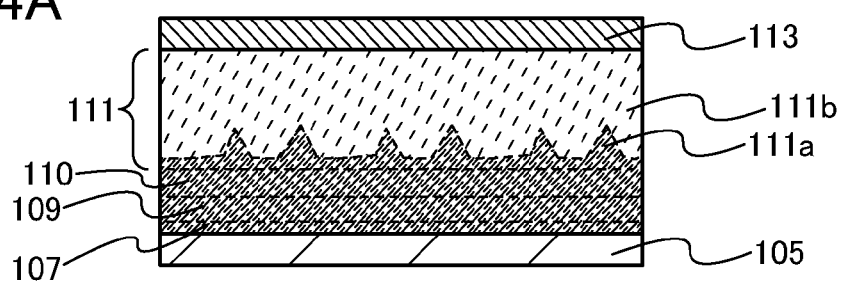
FIGS. 4A and 4B are cross-sectional views illustrating a method for manufacturing a semiconductor device according to one embodiment of the present invention.
Figure 4B:
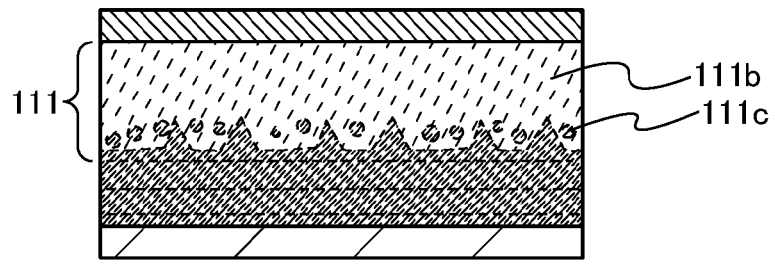

FIGS. 4A and 4B are enlarged views of a portion between the gate insulating film 105 and the impurity semiconductor film 113 illustrated in FIG. 3D.

As illustrated in FIG. 4A, the microcrystalline semiconductor region 111a in the semiconductor film 111 has a projection and a depression; the projection has a conical or pyramidal shape whose width decreases from the gate insulating film 105 side toward the amorphous semiconductor region 111b side (a tip of the projection has an acute angle). Note that the microcrystalline semiconductor region 111a may have a projection whose width increases from the gate insulating film 105 side toward the amorphous semiconductor region 111b side (an inverted conical or pyramidal shape).

By setting the thickness of the seed crystal 107, the first microcrystalline semiconductor film 109, the second microcrystalline semiconductor film 110, and the microcrystalline semiconductor region 111a, that is, the distance from the interface between the gate insulating film 105 and the seed crystal 107 to the tip of the projection of the microcrystalline semiconductor region 111a to greater than or equal to 5 nm and less than or equal to 310 nm, the off-state current of the thin film transistor can be reduced.

Further, it is preferable that the oxygen concentration in the semiconductor film 111 which is measured by secondary ion mass spectrometry be less than $1 \times 10^{18}$ atoms/cm$^3$, because such an oxygen concentration can increase the crystallinity of the microcrystalline semiconductor region 111a. The nitrogen concentration profile of the semiconductor film 111 which is measured by secondary ion mass spectrometry has a peak concentration greater than or equal to $1 \times 10^{20}$ atoms/cm$^3$ and less than or equal to $1 \times 10^{21}$ atoms/cm$^3$, preferably greater than or equal to $2 \times 10^{20}$ atoms/cm$^3$ and less than or equal to $1 \times 10^{21}$ atoms/cm$^3$ or less.

The amorphous semiconductor region 111b includes an amorphous semiconductor containing nitrogen. Nitrogen in the amorphous semiconductor containing nitrogen may exist, for example, as an NH group or an NH$_2$ group. Amorphous silicon is used as an amorphous semiconductor.

The amorphous semiconductor containing nitrogen is a semiconductor having lower energy at an Urbach edge measured by a constant photocurrent method (CPM) or photoluminescence spectroscopy and a smaller amount of absorption spectra of defective levels as compared to a conventional amorphous semiconductor. In other words, as compared to the conventional amorphous semiconductor, the amorphous silicon containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunnel current does not flow easily. Therefore, when the amorphous semiconductor containing nitrogen is provided between the microcrystalline semiconductor region 111a and the impurity semiconductor film 113, the off-state current of the thin film transistor can be reduced. In addition, by providing the amorphous semiconductor containing nitrogen, the on-state current and the field-effect mobility can be increased.

Further, a peak region of a spectrum of the amorphous semiconductor containing nitrogen obtained by low-temperature photoluminescence spectroscopy is greater than or equal to 1.31 eV and less than or equal to 1.39 eV. Note that a peak region of a spectrum of a microcrystalline semiconductor, typically microcrystalline silicon, obtained by low-temperature photoluminescence spectroscopy is greater than or equal to 0.98 eV and less than or equal to 1.02 eV, which shows that an amorphous semiconductor containing nitrogen is different from a microcrystalline semiconductor.

The microcrystalline semiconductor region 111a, as well as the amorphous semiconductor region 111b, may include a NH group or an $NH_2$ group.

Further, as illustrated in FIG. 4B, a semiconductor mixed phase grain 111c whose grain size is greater than or equal to 1 nm and less than or equal to 10 nm, preferably greater than or equal to 1 nm and less than or equal to 5 nm is included in the amorphous semiconductor region 111b, whereby the on-state current and the filed-effect mobility can be further increased.

A microcrystalline semiconductor having a projection shape (a conical or pyramidal shape) whose width decreases from the gate insulating film 105 side toward the amorphous semiconductor region 111b side is formed in the following manner. After a microcrystalline semiconductor film is formed under a condition where a microcrystalline semiconductor is deposited, crystal growth is caused under a condition where crystal growth is partly suppressed while an amorphous semiconductor is deposited.

Since the microcrystalline semiconductor region 111a in the semiconductor film 111 has the conical or pyramidal shape or the inverted conical or pyramidal shape, resistance in the vertical direction (in the film thickness direction) of when voltage is applied between the source and drain electrodes in an on state, i.e. the resistance of the semiconductor film 111 can be lowered. Further, tunnel current does not easily flow since the amorphous semiconductor containing nitrogen which is a well-ordered semiconductor having fewer defects and a steep tail of a level at a band edge in the valence band is provided between the microcrystalline semiconductor region 111a and the impurity semiconductor film 113. Thus, in the thin film transistor described in this embodiment, the on-state current and the field-effect mobility can be increased and the off-state current can be reduced.

Here, the semiconductor film 111 including the microcrystalline semiconductor region 111a and the amorphous semiconductor region 111b is formed using the source gas including the gas containing nitrogen. Alternatively, the semiconductor film 111 including the microcrystalline semiconductor region 111a and the amorphous semiconductor region 111b can be formed in the following manner: the top surface of the microcrystalline semiconductor film 109 is exposed to a gas containing nitrogen so that nitrogen is adsorbed to the top surface of the microcrystalline semiconductor film 109, and then film deposition of the semiconductor film 111 including the microcrystalline semiconductor region 111a and the amorphous semiconductor region 111b is performed using hydrogen and a deposition gas containing silicon or germanium as a source gas.

The impurity semiconductor film 113 is formed using amorphous silicon to which phosphorus is added, microcrystalline silicon to which phosphorus is added, or the like. Alternatively, the impurity semiconductor film 113 can have a stacked structure of amorphous silicon to which phosphorus is added and microcrystalline silicon to which phosphorus is added. Note that, in the case of forming a p-channel thin film transistor as a thin film transistor, the impurity semiconductor film 113 is formed using microcrystalline silicon to which boron is added, amorphous silicon to which boron is added, or the like. In the case where the semiconductor film 111 forms an ohmic contact with wirings 129a and 129b which are formed later, the impurity semiconductor film 113 is not necessarily formed.

The impurity semiconductor film 113 is formed in a process chamber of the plasma CVD apparatus by glow discharge plasma using a mixture of hydrogen, phosphine (diluted with hydrogen or silane), and a deposition gas containing silicon, whereby amorphous silicon to which phosphorus is added or microcrystalline silicon to which phosphorus is added is formed. In the case of manufacturing a p-channel thin film transistor, the impurity semiconductor film 113 may be formed using glow discharge plasma using diborane instead of phosphine.

Further, in the case where the impurity semiconductor film 113 is formed using microcrystalline silicon to which phosphorus is added or microcrystalline silicon to which boron is added, a microcrystalline semiconductor film, typically a microcrystalline silicon film, is formed between the semiconductor film 111 and the impurity semiconductor film 113, so that characteristics of the interface can be improved. As a result, resistance generated at the interface between the impurity semiconductor film 113 and the semiconductor film 111 can be reduced. Therefore, the amount of current flowing through the source region, the semiconductor film, and the drain region of the thin film transistor can be increased and the on-state current and the field-effect mobility can be increased.

The mask 115 formed of a resist can be formed by a photolithography step.

Next, the seed crystal 107, the first microcrystalline semiconductor film 109, the second microcrystalline semiconductor film 110, the semiconductor film 111, and the impurity semiconductor film 113 are selectively etched using the resist mask 115. Through this step, the seed crystal 107, the first microcrystalline semiconductor film 109, the second microcrystalline semiconductor film 110, the semiconductor film 111, and the impurity semiconductor film 113 are divided for each element, whereby an island-shaped semiconductor stacked body 117 and an island-shaped impurity semiconductor film 121 are formed. The semiconductor stacked body 117 includes the seed crystal 107, the first microcrystalline semiconductor film 109, the second microcrystalline semiconductor film 110, and the semiconductor film 111. The semiconductor stacked body 117 includes a microcrystalline semiconductor region 117a which includes the seed crystal 107, the first microcrystalline semiconductor film 109, the second microcrystalline semiconductor film 110, and the microcrystalline semiconductor region 111a of the semiconductor film 111; and an amorphous semiconductor region 117b which includes the amorphous semiconductor region 111b of the semiconductor film 111. Then, the resist mask 115 is removed (see FIG. 3E).

Figure 5A:
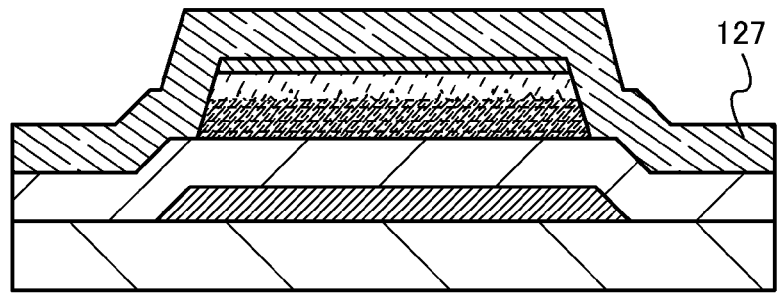
FIGS. 5A to 5C are cross-sectional views illustrating a method for manufacturing a semiconductor device according to one embodiment of the present invention.

Next, a conductive film 127 is formed over the impurity semiconductor film 121 (see FIG. 5A). The conductive film 127 can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode layer 103) may also be used. Crystalline silicon to which an impurity element which serves as a donor is added may be used. A stacked-layer structure in which a film on the side that is in contact with the crystalline silicon to which an impurity element serving as a donor is added is formed using titanium, tantalum, molybdenum, tungsten, or a nitride of any of these elements, and a layer of aluminum or an aluminum alloy is formed thereover may also be formed. The conductive film 127 may also have a stacked-layer structure where aluminum or an aluminum alloy is provided and titanium, tantalum, molybdenum, tungsten, or nitride of any of these elements is provided thereon and thereunder. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an inkjet method, or the like and baking the conductive nanopaste.

Figure 5B:
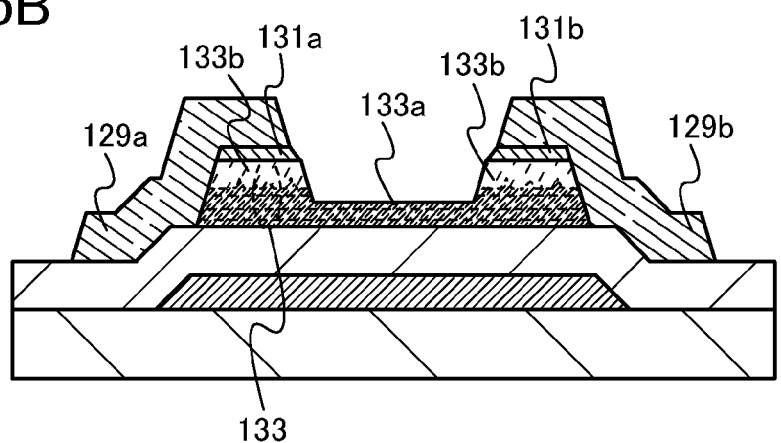

Then, a mask is formed of a resist by a photolithography step, and the conductive film 127 is etched with the use of the resist mask, whereby the wirings 129a and 129b serving as a source electrode and a drain electrode are formed (see FIG. 5B). The etching of the conductive film 127 may be either dry etching or wet etching. Note that one of the wirings 129a and 129b serves as a signal line as well as a source electrode or a drain electrode. However, without limitation thereto, a signal line may be provided separately from the source and drain electrodes.

Then, the impurity semiconductor film 121 and the semiconductor stacked body 117 are partly etched, whereby a pair of impurity semiconductor films 131a and 131b serving as a source and drain regions is formed. Also, a semiconductor stacked body 133 including a microcrystalline semiconductor region 133a and a pair of amorphous semiconductor regions 133b is formed. At this point, the semiconductor stacked body 117 is etched so that the microcrystalline semiconductor region 133a is exposed, whereby the semiconductor stacked body 133 having the following structure is formed: in regions which are covered with the wirings 129a and 129b, the microcrystalline semiconductor region 133a and the amorphous semiconductor regions 133b are stacked, and in a region which is covered with neither the wiring 129a nor the wiring 129b and overlaps with the gate electrode, the microcrystalline semiconductor region 133a is exposed.

Here, ends of the wirings 129a and 129b are aligned with ends of the impurity semiconductor films 131a and 131b. However, the ends of the wirings 129a and 129b and the ends of the impurity semiconductor films 131a and 131b are not necessarily aligned with each other; the ends of the wirings 129a and 129b may be positioned on the inner side than the ends of the impurity semiconductor films 131a and 131b in a cross section.

Next, dry etching may be performed. The dry etching is performed under a condition where the exposed microcrystalline semiconductor region 133a and the exposed amorphous semiconductor regions 133b are not damaged and the etching rates of the microcrystalline semiconductor region 133a and the amorphous semiconductor regions 133b are low. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Then, the surfaces of the microcrystalline semiconductor region 133a and the amorphous semiconductor regions 133b are subjected to plasma treatment typified by water plasma treatment, oxygen plasma treatment, ammonia plasma treatment, nitrogen plasma treatment, plasma treatment using a mixed gas of oxygen and hydrogen, or the like.

Water plasma treatment can be performed in such a manner that a gas containing water as a main component typified by water vapor ($H_2O$ vapor) is introduced into a reaction space and plasma is generated. After that, the mask formed of a resist is removed. The mask formed of a resist may be removed before the dry etching of the impurity semiconductor film 121 and the semiconductor stacked body 117.

As described above, after the microcrystalline semiconductor region 133a and the amorphous semiconductor regions 133b are formed, dry etching is additionally performed under a condition where the microcrystalline semiconductor region 133a and the amorphous semiconductor regions 133b are not damaged, whereby an impurity such as a residue over the exposed microcrystalline semiconductor region 133a and the exposed amorphous semiconductor regions 133b can be removed. Further, after the dry etching, water plasma treatment is successively performed, whereby a residue of the resist mask can be removed and defects of the microcrystalline semiconductor region 133a can be reduced. Further, by the plasma treatment, insulation between the source region and the drain region can be ensured. Thus, in the resulting thin film transistors, off-state current can be reduced and a variation in electrical characteristics can be reduced.

Note that the mask is formed of a resist by a photolithography step over the conductive film 127, and the conductive film 127 is etched using the resist mask; whereby the wirings 129a and 129b serving as the source and drain electrodes are formed. Then, the impurity semiconductor film 121 is etched, whereby the pair of impurity semiconductor films 131a and 131b serving as the source and drain electrodes is formed. At this time, part of the semiconductor stacked body 117 is etched in some cases. Then, the semiconductor stacked body 117 may be partly etched after the mask formed of a resist is removed to form the semiconductor stacked body 133 including the microcrystalline semiconductor region 133a and the pair of amorphous semiconductor regions 133b.

Since the microcrystalline semiconductor region 117a is covered with the amorphous semiconductor region 117b in the step of removing the mask formed of a resist, the microcrystalline semiconductor region 117a is prevented from being in contact with a resist stripper and a residue of the resist. Further, since the amorphous semiconductor region 117b is etched using the wirings 129a and 129b to expose the microcrystalline semiconductor region 133a after the mask formed of a resist is removed, the amorphous semiconductor region which is in contact with the resist stripper and a residue of the resist is not left in a back channel. Consequently, leakage current due to the resist stripper and the residue of the resist left in the back channel is not generated, which can further reduce the off-state current of the thin film transistor.

Through the above-described process, a single-gate thin film transistor can be manufactured. A single-gate thin film transistor with low off-state current, high on-state current, and high field-effect mobility can be manufactured with high productivity.

Then, an insulating film (also referred to as a second gate insulating film) 137 is formed over the semiconductor stacked body 133, the impurity semiconductor films 131a and 131b, and the wirings 129a and 129b. The insulating film 137 can be formed in a manner similar to that of the gate insulating film 105.

Then, an opening (not illustrated) is formed in the insulating film 137 with the use of a mask which is formed of a resist by a photolithography step. Then, a back gate electrode (also referred to as a second gate electrode) 139 is formed over the insulating film 137 (see FIG. 5C). Through the above-described process, a dual-gate thin film transistor can be manufactured. Note that although not shown, a pixel electrode connected to one of the wirings 129a and 129b can be formed at the same time as the formation of the back gate electrode 139.

The back gate electrode 139 can be formed in a manner similar to that of the wirings 129a and 129b. The back gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back gate electrode 139 can be formed using a conductive composition including a conductive high molecule (also referred to as a conductive polymer) having a light-transmitting property. The back gate electrode 139 preferably has a sheet resistance of 10000 Ω/sq. or less and a light transmittance of 70% or greater at a wavelength of 550 nm. Further, the resistivity of the conductive high molecule included in the conductive composition is preferably 0.1 Ω·cm or less.

As the conductive high molecule, a so-called π-electron conjugated conductive high molecule can be used. For example, polyaniline and a derivative thereof, polypyrrole and a derivative thereof, polythiophene and a derivative thereof, and a copolymer of two or more of aniline, pyrrole, and thiophene and a derivative thereof can be given.

The back gate electrode 139 can be formed by forming a thin film using any of the above materials by a sputtering method, and then etching the thin film using a mask formed of a resist by a photolithography step. Alternatively, the back gate electrode 139 can be formed by applying or printing the conductive composition including a conductive high molecule having a light-transmitting property, and baking the composition.

Next, the shape of the back gate electrode is described with reference to FIGS. 6A to 6D, which are plan views of the thin film transistor.

Figure 6A:
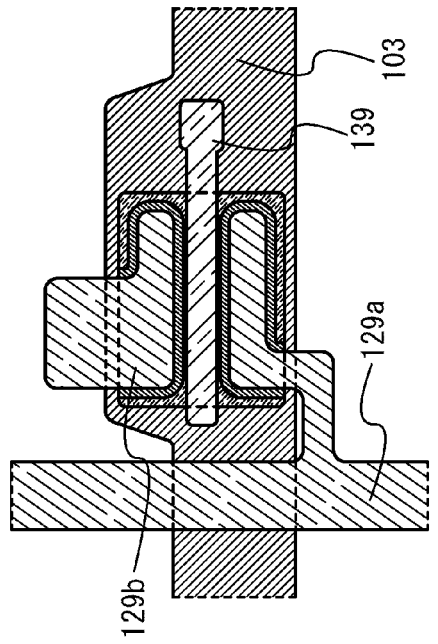
FIGS. 6A to 6D are top views illustrating a method for manufacturing a semiconductor device according to one embodiment of the present invention.

As illustrated in FIG. 6A, the back gate electrode 139 can be formed in parallel to the gate electrode 103. In this case, potential applied to the back gate electrode 139 and potential applied to the gate electrode 103 can be controlled independently. Thus, the threshold voltage of the thin film transistor can be controlled. Further, regions in which carriers flow, that is, channel regions are formed on the gate insulating film 105 side and on the insulating film 137 side in the microcrystalline semiconductor region; thus, the on-state current of the thin film transistor can be increased.

Figure 6B:
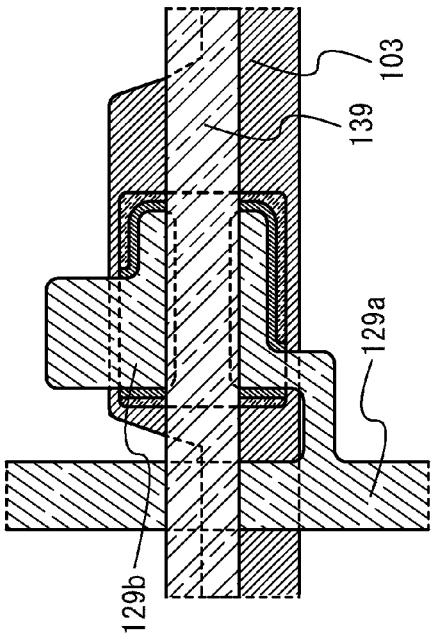

As illustrated in FIG. 6B, the back gate electrode 139 can be connected to the gate electrode 103. That is, the gate electrode 103 and the back gate electrode 139 can be connected through an opening 150 formed in the gate insulating film 105 and the insulating film 137. In this case, potential applied to the back gate electrode 139 and potential applied to the gate electrode 103 are equal. Therefore, regions in which carriers flow in a semiconductor film, that is, channel regions are formed on the gate insulating film 105 side and on the insulating film 137 side in the microcrystalline semiconductor region; thus, the on-state current of the thin film transistor can be increased.

Figure 6C:
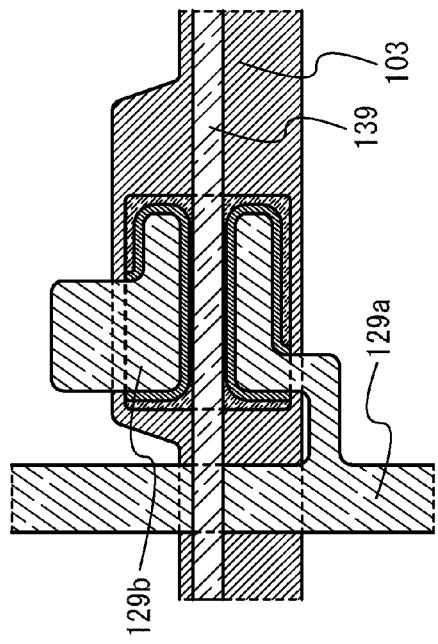

Further alternatively, as illustrated in FIG. 6C, a structure in which the back gate electrode 139 is not connected to the gate electrode 103 and is in a floating state can be employed. In that case, channel regions are formed on the gate insulating film 105 side and on the insulating film 137 side in the microcrystalline semiconductor region without potential applied to the back gate electrode 139; thus, the on-state current of the thin film transistor can be increased.

Figure 6D:
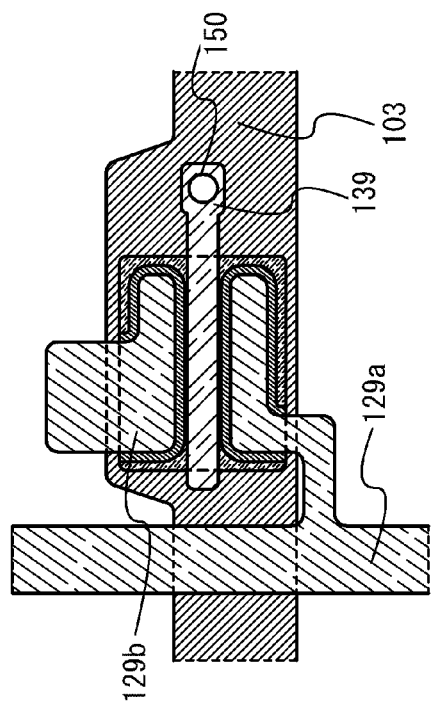

Further, as illustrated in FIG. 6D, the back gate electrode 139 may overlap with the wirings 129a and 129b with the insulating film 137 provided therebetween. Although the back gate electrode 139 of FIG. 6A is used in FIG. 6D, it is possible that the back gate electrode 139 of FIG. 6B or FIG. 6C overlap with the wirings 129a and 129b.

In each of the single-gate thin film transistor and the dual-gate thin film transistor which are described in this embodiment, a channel region can be formed using a microcrystalline semiconductor film whose crystallinity is increased by reducing the space between the mixed phase grains. Therefore, the number of carriers that move in the single-gate thin film transistor and dual-gate thin film transistor is increased, so that the on-state current and the field-effect mobility can be increased. Further, since the microcrystalline semiconductor film having high crystallinity not only on the first gate insulating film side but also on the second gate insulating film side is used as the channel region, the number of carriers that move in the dual-gate thin film transistor is increased, so that the on-state current and the field-effect mobility can be increased. Furthermore, since the amorphous semiconductor regions 133b are provided between the microcrystalline semiconductor region 133a and the impurity semiconductor films 131a and 131b, the off-state current of the thin film transistor can be reduced. Accordingly, the area of the single-gate thin film transistor and the area of the dual-gate thin film transistor can be reduced, which enables high integration of a semiconductor device. Further, when the thin film transistor described in this embodiment is used for a driver circuit of a display device, the area of the driver circuit can be decreased, which enables the frame of the display device to be narrowed.

Embodiment 3

In this embodiment, a method for manufacturing a thin film transistor, by which the off-state current can be further reduced as compared to the off-state current in Embodiment 2, will be described with reference to FIGS. 3A to 3D and FIGS. 7A to 7C.

Figure 7A:
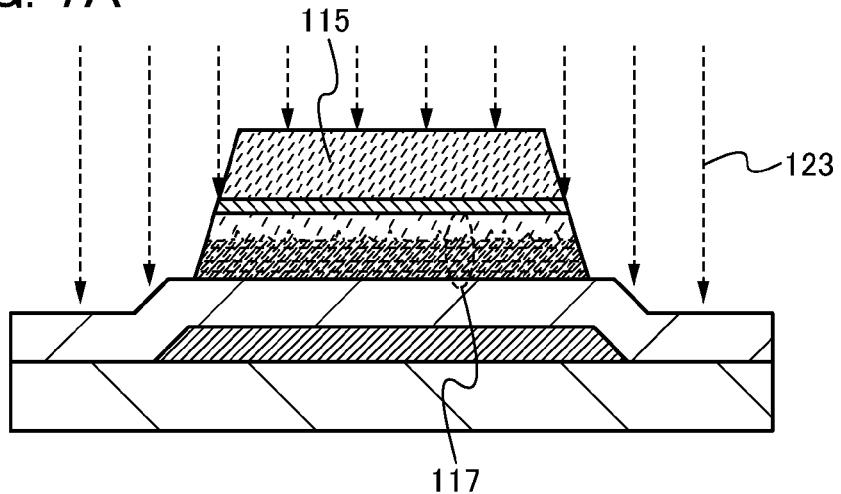
FIGS. 7A to 7C are cross-sectional views illustrating a method for manufacturing a semiconductor device according to one embodiment of the present invention.

As in Embodiment 2, the semiconductor stacked body 117 in FIG. 7A is formed through the process illustrated in FIGS. 3A to 3D.

Next, plasma treatment is performed in which a side surface of the semiconductor stacked body 117 is exposed to plasma 123 while the mask 115 formed of a resist is left. Here, plasma is generated in an oxidizing gas atmosphere or a nitriding gas atmosphere, and the semiconductor stacked body 117 is exposed to the plasma 123. Examples of the oxidizing gas include oxygen, ozone, dinitrogen monoxide, water vapor, and a mixed gas of oxygen and hydrogen. Examples of the nitriding gas include nitrogen, ammonia, nitrogen fluoride, nitrogen chloride, chloroamine, and fluoroamine. By generating plasma in an oxidizing gas or a nitriding gas, an oxygen radical or a nitrogen radical is generated. The radical reacts with the semiconductor stacked body 117, so that an insulating region serving as a barrier region is formed on the side surface of the semiconductor stacked body 117. Note that instead of irradiation with plasma, irradiation with ultraviolet light may be performed for generation of an oxygen radical or a nitrogen radical.

Figure 7B:
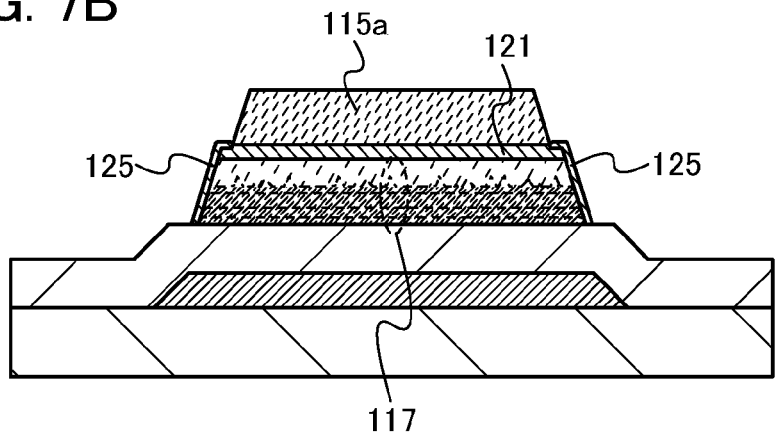
Figure 7C:
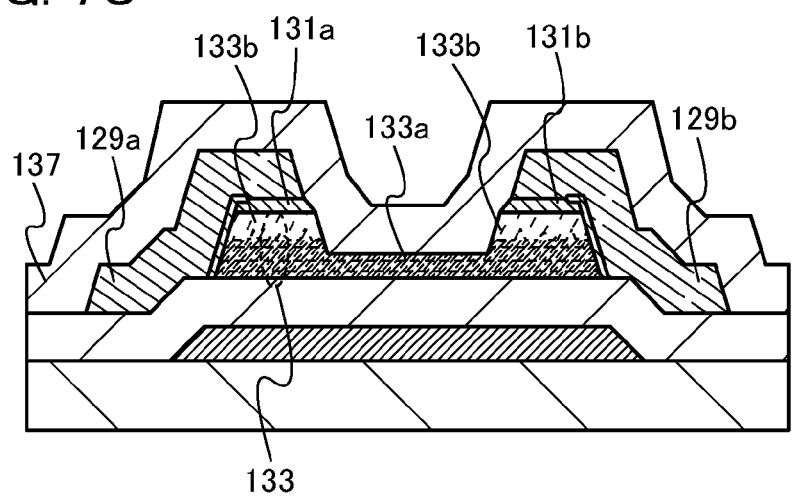

In the case of using oxygen, ozone, water vapor, or a mixed gas of oxygen and hydrogen as the oxidizing gas, the resist recedes by plasma irradiation, whereby a mask 115a having a smaller top surface than the mask 115 is formed as illustrated in FIG. 7B. Consequently, through the plasma treatment, the exposed impurity semiconductor film 121 is oxidized in addition to the side surface of the semiconductor stacked body 117, whereby an insulating region 125 serving as a barrier region is formed on the side surface of the semiconductor stacked body 117 and on the side surface and part of the top surface of the impurity semiconductor film 121.

Figure 5C:
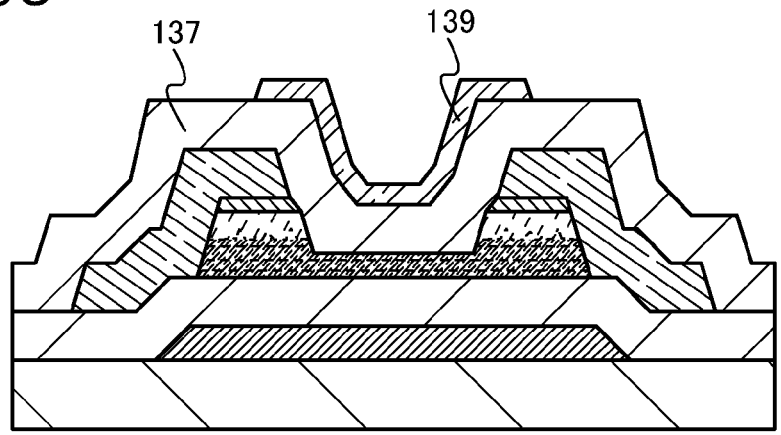

Next, as described in Embodiment 2, through the process illustrated in FIGS. 5A and 5B, the wirings 129a and 129b serving as a source electrode and a drain electrode, the pair of impurity semiconductor films 131a and 131b serving as a source region and a drain region, the semiconductor stacked body 133 including the microcrystalline semiconductor region 133a and the pair of amorphous semiconductor regions 133b, and the insulating film 137 are formed as illustrated in FIG. 5C. Thus, a single-gate thin film transistor can be manufactured.

When a back gate electrode is formed over the insulating film 137, a dual-gate thin film transistor can be manufactured.

In the single-gate thin film transistor and the dual-gate thin film transistor which are described in this embodiment, the channel region can be formed using a microcrystalline semiconductor film whose crystallinity is increased by reduction of the space between the mixed phase grains. Furthermore, by providing the insulating region which is a bather region between the semiconductor stacked body 133 and the wiring 129a or 129b, holes injected from the wiring 129a or 129b to the semiconductor stacked body 133 can be reduced; thus, the off-state current of the thin film transistor is reduced and the on-state current and the field-effect mobility of the thin film transistor are increased. Accordingly, the area of the thin film transistor can be reduced, which enables high integration of a semiconductor device. Further, when the thin film transistor described in this embodiment is used for a driver circuit of a display device, the size of the driver circuit can be decreased, which enables the frame of the display device to be narrowed.

In this embodiment, the description is made with reference to Embodiment 2; however, the description can be made with reference to another embodiment as appropriate.

Embodiment 4

Figure 8:
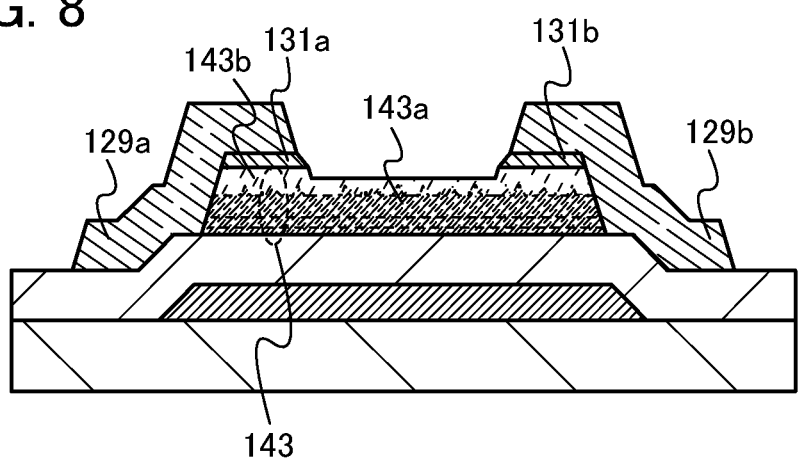
FIG. 8 is a cross-sectional view illustrating a method for manufacturing a semiconductor device according to one embodiment of the present invention.

In this embodiment, a method for manufacturing a thin film transistor formed in a semiconductor device that is one embodiment of the present invention will be described with reference to FIGS. 3A to 3E, FIGS. 5A to 5C, and FIG. 8. FIG. 8 shows a step corresponding to the step illustrated in FIG. 5B.

As in Embodiment 2, the conductive film 127 is formed through the process of FIGS. 3A to 3E and FIG. 5A.

Then, as illustrated in FIG. 8, the wirings 129a and 129b are formed and the impurity semiconductor film 121 and the semiconductor stacked body 117 are partly etched, whereby the pair of impurity semiconductor films 131a and 131b serving as a source and drain regions is formed as in Embodiment 2. Also, a semiconductor stacked body 143 including a microcrystalline semiconductor region 143a and an amorphous semiconductor region 143b is formed. At this point, the semiconductor stacked body 117 is etched so that the amorphous semiconductor region 143b is exposed, whereby the semiconductor stacked body 143 having the following structure is formed: in the regions which are covered with the wirings 129a and 129b, the microcrystalline semiconductor region 143a and the amorphous semiconductor regions 143b are stacked, and in the region which is covered with neither the wiring 129a nor the wiring 129b and overlaps with the gate electrode, the microcrystalline semiconductor region 143a is not exposed and the amorphous semiconductor region 143b is exposed. Note that the etching amount of the semiconductor stacked body 117 here is smaller than that in the case illustrated in FIG. 5B.

The subsequent steps are similar to those in Embodiment 2.

Through the above-described process, a single-gate thin film transistor can be manufactured. Since the back channel side is amorphous in this thin film transistor, the off-state current can be reduced as compared to the thin film transistor illustrated in FIG. 5B.

In this embodiment, after the step illustrated in FIG. 8, the back gate electrode 139 may be formed over the thin film transistor with the insulating film 137 interposed therebetween as in the step illustrated in FIG. 5C.

This embodiment can be implemented in appropriate combination with any of the other embodiments.

Embodiment 5

Thin film transistors are manufactured, and a semiconductor device having a display function (also referred to as a display device) can be manufactured using the thin film transistors in a pixel portion and also in a driver circuit. Further, part or the whole of the driver circuit which includes thin film transistors can be formed over the same substrate as the pixel portion, whereby a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic EL (electroluminescence) element, an organic EL element, and the like. Furthermore, the display device may include a display medium whose contrast is changed by an electric effect, such as electronic ink.

In addition, the display device includes a panel in which the display element is sealed, and a module in which an IC or the like including a controller is mounted on the panel. Further, an embodiment of the present invention relates to one mode of an element substrate before the display element is completed in a process of manufacturing the display device, and the element substrate is provided with a plurality of pixels each having a means for supplying current to the display element. Specifically, the element substrate may be in a state where only a pixel electrode of the display element is formed, a state in which a conductive film to be a pixel electrode is formed but is not etched yet to form the pixel electrode, or any of the other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or TCP provided with a printed wiring board at the end thereof; and a module having an integrated circuit (IC) that is directly mounted on a display element by a chip on glass (COG) method.

Embodiment 6

In this embodiment, a photoelectric conversion device that is one embodiment of a semiconductor device will be described. In the photoelectric conversion device described in this embodiment, a microcrystalline semiconductor film as described in Embodiment 1, whose crystallinity is increased by reduction of the space between mixed phase grains, is used as a semiconductor film. The microcrystalline semiconductor film whose crystallinity is increased by reduction of the space between mixed phase grains is applicable to a semiconductor film having a function of photoelectric conversion, a semiconductor film having a conductivity type, or the like, and is preferably, in particular, applied to the semiconductor film having a function of photoelectric conversion. Further, the microcrystalline semiconductor film whose crystallinity is increased by reduction of the space between mixed phase grains can be provided at an interface between the semiconductor film having a function of photoelectric conversion or the semiconductor film having a conductivity type and another film.

By employing the structure described above, resistance (series resistance) caused by the semiconductor film having a function of photoelectric conversion or the semiconductor film having a conductivity type can be reduced, resulting in improvement of characteristics. Further, it is possible to reduce optical and electrical loss at the interface between the semiconductor film having a function of photoelectric conversion or the semiconductor film having a conductivity type and another film, which can improve the photoelectric conversion efficiency. With reference to FIGS. 9A to 9E, one embodiment of a method for manufacturing a photoelectric conversion device will be described.

Figure 9A:
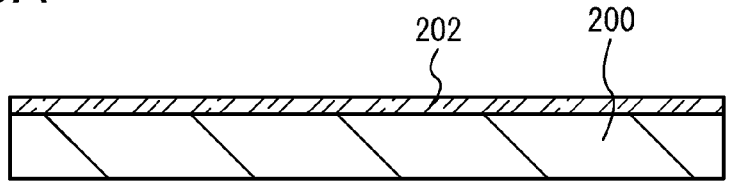
FIGS. 9A to 9E are cross-sectional views illustrating one embodiment of a method for manufacturing a photoelectric conversion device.

As illustrated in FIG. 9A, a first electrode 202 is formed over a substrate 200.

As the substrate 200, any of the substrates that can be used the substrate 51 described in Embodiment 1 can be used as appropriate. Alternatively, a plastic substrate can be used. As the plastic substrate, it is preferable to use a substrate containing a thermosetting resin such an epoxy resin, an unsaturated polyester resin, a polyimide resin, a bismaleimide-triazine resin, or a cyanate resin, or a substrate containing a thermoplastic resin such as a polyphenylene oxide resin, a polyetherimide resin, or a fluorine resin.

Note that a surface of the substrate 200 may have a texture structure. Accordingly, photoelectric conversion efficiency can be improved.

In this embodiment, light is incident on the back side (the lower side in the drawing) of the substrate 200; thus, a light-transmitting substrate is used. Note that when a structure is employed in which light is incident on a side of a second electrode 210 to be formed later (the upper side in the drawing), the substrate is not limited to a light-transmitting substrate. In this case, a semiconductor substrate containing a material such as silicon or a conductive substrate containing a metal material or the like may be used.

The first electrode 202 can be formed using a light-transmitting conductive material that can be used for the back gate electrode 139 described in Embodiment 2. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 Ω/sq. to 200 Ω/sq.

Note that in this embodiment, light is incident on the back side (the lower side in the drawing) of the substrate 200; thus, the first electrode 202 is formed using a light-transmitting conductive material. Note that when a structure is employed in which light is incident on a side of a second electrode 210 to be formed later (the upper side in the drawing), the material of the substrate is not limited to a light-transmitting conductive material. In such a case, the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the substrate 200, the first electrode 202 may have a texture structure. Further, an auxiliary electrode formed using a low-resistance conductive material may be separately formed so as to be in contact with the first electrode 202.

Figure 9B:
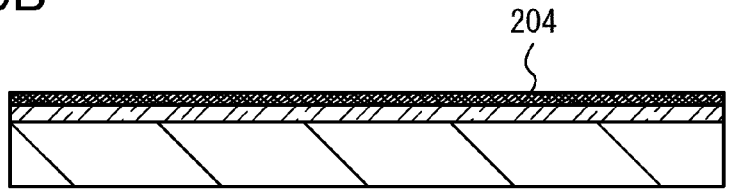

Next, as illustrated in FIG. 9B, a semiconductor film 204 having the first conductivity type is formed over the first electrode 202. The semiconductor film 204 having the first conductivity type is typically formed using a semiconductor film containing a semiconductor material to which an impurity element imparting a conductivity type is added. Silicon is suitable as a semiconductor material, in terms of productivity, price, and the like. When silicon is used as the semiconductor material, phosphorus or arsenic, which imparts n-type conductivity, or boron or aluminum, which imparts p-type conductivity, is used as the impurity element imparting a conductivity type.

In this embodiment, light is incident on the back side (the lower side in the drawing) of the substrate 200; thus, the conductivity type (the first conductivity type) of the semiconductor film 204 having the first conductivity type is preferably p-type. This is because, for instance, the diffusion length of holes is short owing to the lifetime of a hole which is as short as about half the lifetime of an electron, and because more electrons and holes are formed on the side where light is incident on a semiconductor film 206 having a function of photoelectric conversion. When the first conductivity type is p-type, current can be extracted before holes are annihilated, whereby a decrease in photoelectric conversion efficiency can be suppressed. Note that when the above problems do not occur, for example, when the semiconductor film 206 having a function of photoelectric conversion is sufficiently thin, the first conductivity type may be n-type.

There are other semiconductor materials which can be used for the semiconductor film 204 having the first conductivity type; for example, silicon carbide, germanium, gallium arsenide, indium phosphide, zinc selenide, gallium nitride, and silicon germanium are given. Further, a semiconductor material containing an organic material, a semiconductor material containing a metal oxide, or the like can be used. The material can be selected as appropriate in consideration of the semiconductor film 206 having a function of photoelectric conversion.

Although there is no particular limitation on the crystallinity of the semiconductor film 204 having the first conductivity type, it is preferable to use the microcrystalline semiconductor film whose crystallinity is increased by reduction of the space between mixed phase grains, which is described in Embodiment 1, as the semiconductor film 204 having the first conductivity type. This is because in this case, as compared with the case of using a conventional microcrystalline semiconductor film, it is possible to reduce series resistance and to suppress optical and electrical loss at the interface between the microcrystalline semiconductor film whose crystallinity is increased and another film. It is needless to say that another semiconductor such as an amorphous semiconductor, a polycrystalline semiconductor, and a single crystal semiconductor can also be used.

Like the surface of the substrate 200, the semiconductor film 204 having the first conductivity type may have a texture structure.

The semiconductor film 204 having the first conductivity type can be formed by a plasma CVD method using diborane and a deposition gas containing silicon. Further, the semiconductor film 204 having the first conductivity type is formed to a thickness of 1 nm to 100 nm, preferably 5 nm to 50 nm.

Alternatively, the semiconductor film 204 having the first conductivity type may be formed as follows: a silicon film to which an impurity element imparting a conductivity type is not added is formed by a plasma CVD method or the like; and boron is added by an ion implantation method or the like.

Figure 9C:
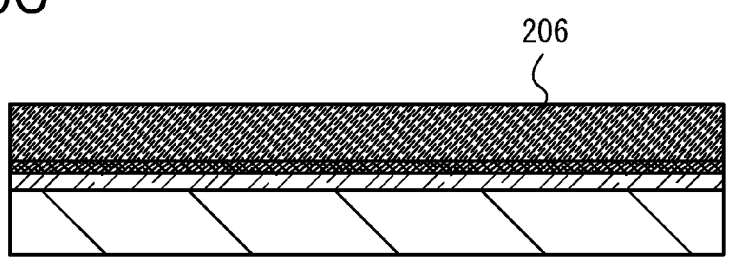

Next, as illustrated in FIG. 9C, the semiconductor film 206 having a function of photoelectric conversion is formed over the semiconductor film 204 having the first conductivity type. For the semiconductor film 206 having a function of photoelectric conversion, a semiconductor film formed using a semiconductor material which is similar to that of the semiconductor film 204 is used. In other words, as the semiconductor material, silicon, silicon carbide, germanium, gallium arsenide, indium phosphide, zinc selenide, gallium nitride, silicon germanium, or the like is used. In particular, silicon is preferably used. Alternatively, a semiconductor material containing an organic material, a semiconductor material containing a metal oxide, or the like can be used.

As the semiconductor film 206 having a function of photoelectric conversion, the microcrystalline semiconductor film whose crystallinity is increased by reduction of the space between mixed phase gains, such as that described in Embodiment 1, is preferably used. By applying the microcrystalline semiconductor film whose crystallinity is increased by reduction of the space between mixed phase grains, such as that described in Embodiment 1, to the semiconductor film, it is possible to reduce series resistance and to suppress optical and electrical loss at the interface between the microcrystalline semiconductor film whose crystallinity is increased and another film as compared with the case of using a conventional microcrystalline semiconductor film.

Because the semiconductor film 206 having a function of photoelectric conversion needs to absorb light sufficiently, it preferably has a thickness of about 100 nm to 10 μm.

Figure 9D:
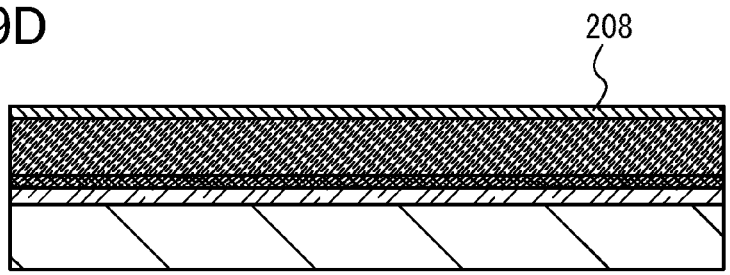

Next, as illustrated in FIG. 9D, a semiconductor film 208 having the second conductivity type is formed over the semiconductor film 206 having a function of photoelectric conversion. In this embodiment, the second conductivity type is n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are similar to those for the semiconductor film 204 having the first conductivity type.

The semiconductor film 208 having the second conductivity type can be formed in a manner similar to that of the semiconductor film 204 having the first conductivity type. For example, the semiconductor film 208 having the second conductivity type can be formed by a plasma CVD method using phosphine and a deposition gas containing silicon. As the semiconductor film 208 having the second conductivity type, the microcrystalline semiconductor film whose crystallinity is increased by reduction of the space between mixed phase grains, which is described in Embodiment 1, is preferably used.

In this embodiment, light is incident on the back side (the lower side in the drawing) of the substrate 200; thus, the conductivity type (the second conductivity type) of the semiconductor film 208 is n-type; however, one embodiment of the disclosed invention is not limited thereto. When the first conductivity type is n-type, the second conductivity type is p-type.

Figure 9E:
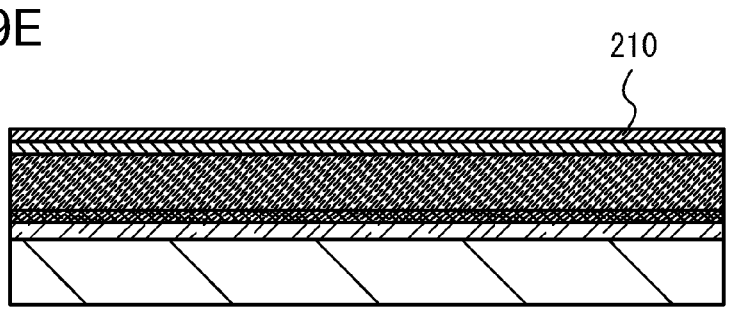

Then, as illustrated in FIG. 9E, the second electrode 210 is formed over the semiconductor film 208 having the second conductivity type. The second electrode 210 is formed using a conductive material such as metal. They can be formed using a material that easily reflects light, such as aluminum, silver, titanium, or tantalum. Such a material is preferably used because light that fails to be absorbed by the semiconductor film 206 can be incident on the semiconductor film 206 again; thus, photoelectric conversion efficiency can be improved.

As a method of forming the second electrode 210, there are a sputtering method, a vacuum evaporation method, a CVD method, a coating method, a printing method, and the like. Further, the second electrode 210 is formed to a thickness of 10 nm to 500 nm, preferably 50 nm to 100 nm.

Note that in this embodiment, light is incident on the back side (the lower side in the drawing) of the substrate 200 and the second electrode 210 is formed using a conductive material which does not have a light-transmitting property, but the structure of the second electrode 210 is not limited thereto. For example, when light is incident on the second electrode 210 side (the upper side in the drawing), the second electrode 210 can be formed using any of the light-transmitting conductive materials for the first electrode 202.

Further, an auxiliary electrode formed using a low-resistance conductive material may be formed so as to be in contact with the second electrode 210.

By the above method, it is possible to manufacture a photoelectric conversion device in which a microcrystalline semiconductor film whose crystallinity is increased by reduction of the space between the mixed phase grains is used as any of a semiconductor film having a function of photoelectric conversion, a semiconductor film having the first conductivity type, and a semiconductor film having the second conductivity type. This can enhance the photoelectric conversion efficiency of a photoelectric conversion device. Note that, as long as the microcrystalline semiconductor film whose crystallinity is increased by reduction of the space between the mixed phase grains is used as one of the semiconductor film having a function of photoelectric conversion, the semiconductor film having the first conductivity type, and the semiconductor film having the second conductivity type, the film to which the microcrystalline semiconductor film is applied can be changed as appropriate. Further, when the microcrystalline semiconductor films whose crystallinity is increased by reduction of the space between the mixed phase grains are used as more than one of the above semiconductor films, the photoelectric conversion efficiency can be more effectively improved.

Note that although a photoelectric conversion device having one unit cell is described in this embodiment, a photoelectric conversion device in which two or more unit cells are stacked as appropriate may be provided.

This embodiment can be implemented in appropriate combination with any of the other embodiments.

Embodiment 7

Figure 10:
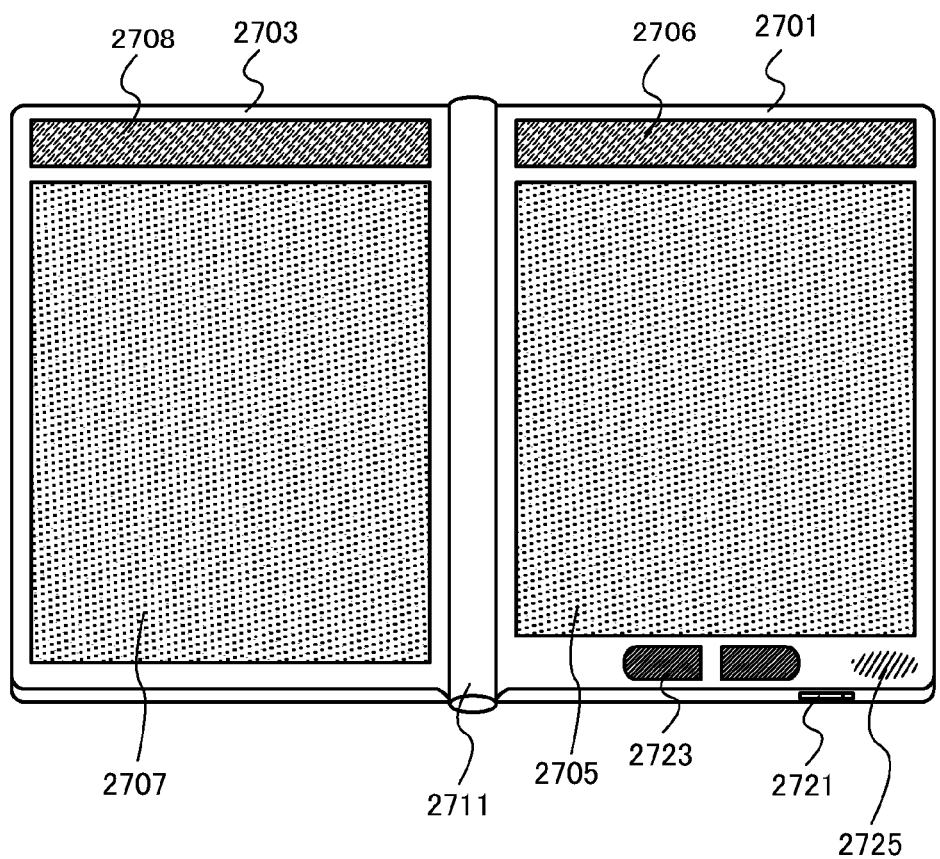
FIG. 10 is a plan view illustrating one example of an electronic book reader.

A semiconductor device disclosed in this specification can be applied to an electronic paper. The electronic paper can be used for electronic devices for displaying information in a variety of fields. For example, an electronic paper can be applied to electronic book readers (e-book readers), posters, digital signage, public information displays (PIDs), advertisements in vehicles such as trains, and displays of various cards such as credit cards. FIG. 10 illustrates an example of the electronic devices.

FIG. 10 illustrates an example of an electronic book reader. For example, an electronic book reader 2700 includes two housings, a housing 2701 and a housing 2703. The housing 2701 and the housing 2703 are combined with the use of a hinge 2711 so that the electronic book reader 2700 can be opened and closed using the hinge 2711 as an axis. With such a structure, the electronic book reader 2700 can be handled like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display a continuous image or different images. In the case where the display portions display different images, for example, a display portion on the right (the display portion 2705 in FIG. 10) can display text and a display portion on the left (the display portion 2707 in FIG. 10) can display graphics.

FIG. 10 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to an AC adapter or a variety of cables such as a USB cable, or the like), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

Embodiment 8

The semiconductor device disclosed in this specification can be applied to a variety of electronic devices (including game machines). Examples of such electronic devices include a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio player, a large-sized game machine such as a pinball machine, and the like.

Figure 11A:
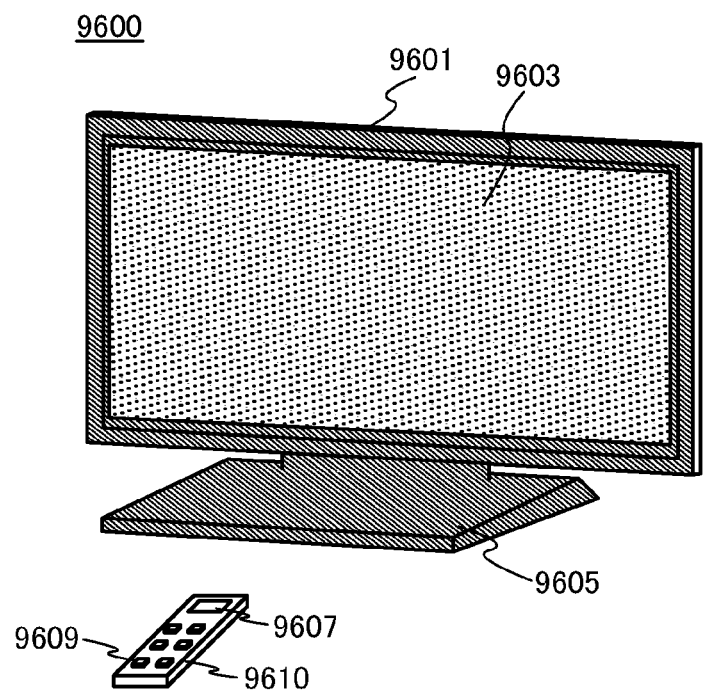
FIGS. 11A and 11B are perspective views illustrating examples of a television device and a digital photo frame.

FIG. 11A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 11B:
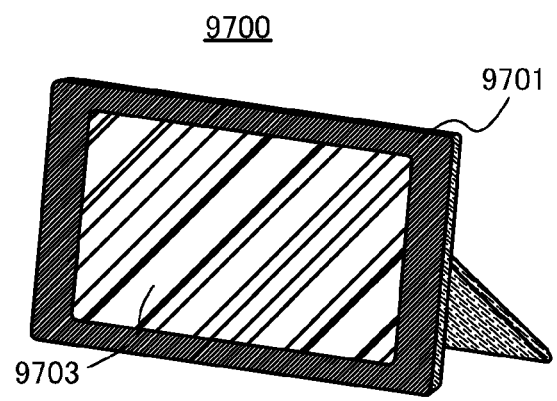

FIG. 11B illustrates an example of a digital photo frame. In a digital photo frame 9700, for example, a display portion 9703 is incorporated in a housing 9701. The display portion 9703 can display a variety of images. For example, the display portion can display image data taken with a digital camera or the like and function like a normal photo frame.

Note that the digital photo frame 9700 is provided with an operation portion, an external connection terminal (e.g., a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a memory that stores image data taken with a digital camera is inserted into the storage medium insertion portion of the digital photo frame and the data can be loaded and displayed on the display portion 9703.

The digital photo frame 9700 may be configured to transmit and receive data wirelessly. Through wireless communication, desired image data can be loaded to be displayed.

Figure 12:
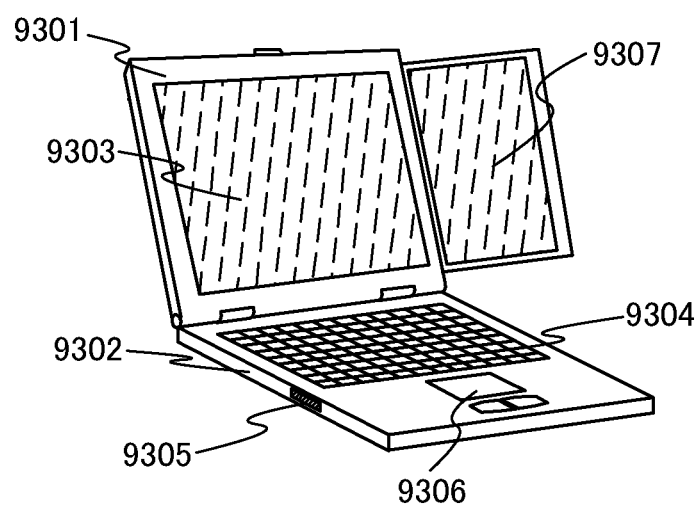
FIG. 12 is a perspective view illustrating one example of a portable computer.

FIG. 12 is a perspective view illustrating an example of a portable computer.

In the portable computer illustrated in FIG. 12, a top housing 9301 having a display portion 9303 and a bottom housing 9302 having a keyboard 9304 can overlap with each other by closing a hinge unit which connects the top housing 9301 and the bottom housing 9302. Thus, the portable computer is conveniently carried. When the user uses the keyboard for input of data, the hinge unit is opened so that the user can input data looking at the display portion 9303.

The bottom housing 9302 includes a pointing device 9306 with which input can be performed, in addition to the keyboard 9304. When the display portion 9303 is a touch screen, the user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the angle of a screen of the display portion 9307 which can be stored in the top housing 9301. If the display portion 9307 which can be stored in the top housing 9301 is a touch screen, the user can input data by touching part of the display portion 9307 which can be stored in the top housing 9301.

The display portion 9303 or the display portion 9307 which can be stored in the top housing 9301 is formed using an image display device such as a liquid crystal display panel or a light-emitting display panel with the use of an organic light-emitting element or an inorganic light-emitting element.

In addition, the portable computer illustrated in FIG. 12 can be provided with a receiver and the like and can receive a TV broadcast to display an image on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303 and, in addition, only a circuit for displaying a TV broadcast is operated. Thus, power consumption can be minimized, which is advantageous for the portable computer whose battery capacity is limited.

Example 1

In this example, a microcrystalline semiconductor film having high crystallinity can be formed while a space between mixed phase grains in the seed crystal is filled by forming a microcrystalline semiconductor film in three steps: formation of a seed crystal under a first condition, formation of a first microcrystalline semiconductor film under a second condition, and formation of a second microcrystalline semiconductor film under a third condition as described in Embodiment 1.

First, a method for forming a microcrystalline semiconductor film using the method described in Embodiment 1 will be described.

A silicon nitride film with a thickness of 300 nm was formed as an insulating film over a glass substrate (EAGLE XG manufactured by Corning Incorporated), and the silicon nitride film was subjected to $N_2O$ plasma treatment. Then, a seed crystal with a thickness of 5 nm was formed by a plasma CVD method over the silicon nitride film, a first microcrystalline film with a thickness of 25 nm was formed by a plasma CVD method over the silicon nitride film and the seed crystal, and then a second microcrystalline semiconductor film with a thickness of 40 nm was formed by a plasma CVD method over the first microcrystalline semiconductor film.

The silicon nitride film was formed by plasma discharge performed under the following conditions: silane, hydrogen, nitrogen, and ammonia were introduced as source gas at flow rates of 15 sccm, 200 sccm, 180 sccm, and 500 sccm, respectively; the pressure in a process chamber was 100 Pa; the RF power supply frequency was 13.56 MHz; and the power of the RF power supply was 200 W. Note that in the deposition of the silicon nitride film, a parallel-plate plasma CVD apparatus was used, the temperature of an upper electrode was 250° C., the temperature of a lower electrode was 290° C., and the distance (the gap) between the upper electrode and the lower electrode was 30 mm.

The plasma treatment on the silicon nitride film was performed by plasma discharge for three minutes under the following conditions: dinitrogen monoxide was introduced into a process chamber at a flow rate of 400 sccm, the pressure in the process chamber was 60 Pa, and the power was 300 W. Note that for the plasma treatment, a parallel-plate plasma treatment apparatus was used, the temperature of an upper electrode was 250° C., the temperature of a lower electrode was 290° C., and the distance between the upper electrode and the lower electrode was 30 mm.

The seed crystal was formed by plasma discharge performed under the following conditions: silane, hydrogen, and argon were introduced as source gas at flow rates of 2.5 sccm, 750 sccm, and 750 sccm, respectively; the pressure in a process chamber was 532 Pa; the RF power supply frequency was 13.56 MHz; and the power of the RF power supply was 50 W. Note that in the deposition of the seed crystal, a parallel-plate plasma CVD apparatus was used, the temperature of an upper electrode was 250° C., the temperature of a lower electrode was 290° C., and the distance between the upper electrode and the lower electrode was 7 mm.

The first microcrystalline semiconductor film was formed by plasma discharge performed under the following conditions: silane, hydrogen, and argon were introduced as source gas at flow rates of 2 sccm, 1500 sccm, and 1500 sccm, respectively; the pressure in a process chamber was 10000 Pa; the RF power supply frequency was 13.56 MHz; and the power of the RF power supply was 350 W. Note that in the deposition of the first microcrystalline semiconductor film, a parallel-plate plasma CVD apparatus was used, the temperature of an upper electrode was 250° C., the temperature of a lower electrode was 290° C., and the distance between the upper electrode and the lower electrode was 7 mm.

The deposition conditions other than the flow rate of silane for the second microcrystalline semiconductor film are similar to those for the first microcrystalline semiconductor film. For Sample 1, a period in which silane flows at a flow rate of 1 sccm for 10 seconds and a period in which silane flows at a flow rate of 0.1 sccm for 5 seconds were repeated. For Sample 2, a period in which silane flows at a flow rate of 2 sccm for 10 seconds and a period in which silane flows at a flow rate of 0.1 sccm for 5 seconds were repeated.

Figure 13A:
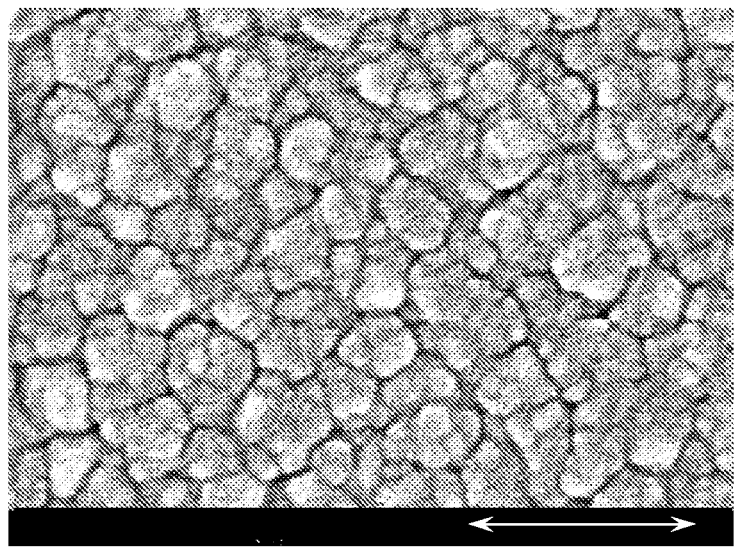
FIGS. 13A and 13B are SEM photographs of microcrystalline silicon films.
Figure 13B:
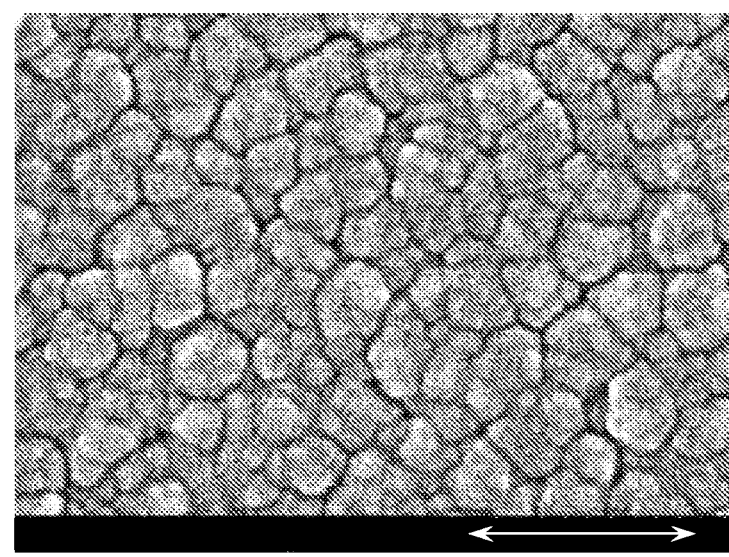

FIGS. 13A and 13B show scanning electron microscope (SEM) photographs (magnified 0.2 million times) of microcrystalline semiconductor films of Sample 1 and Sample 2. As shown in FIGS. 13A and 13B, it was confirmed that mixed phase grains are densely included in the microcrystalline semiconductor films formed in three steps, such as Sample 1 and Sample 2.

Here, a manufacturing method of a microcrystalline semiconductor film formed in one step as a comparative example will be described.

A silicon nitride film with a thickness of 300 nm was formed as an insulating film over a glass substrate (EAGLE XG manufactured by Corning Incorporated), and the silicon nitride film was subjected to $N_2O$ plasma treatment. Then, a microcrystalline film with a thickness of 70 nm was formed by a plasma CVD method over the silicon nitride film.

The deposition of the silicon nitride film and the plasma treatment on the silicon nitride film were performed under the similar conditions as those of Sample 1 and Sample 2. The deposition of the microcrystalline semiconductor film was performed under the condition for depositing the seed crystal in Sample 1 and Sample 2.

Figure 15:
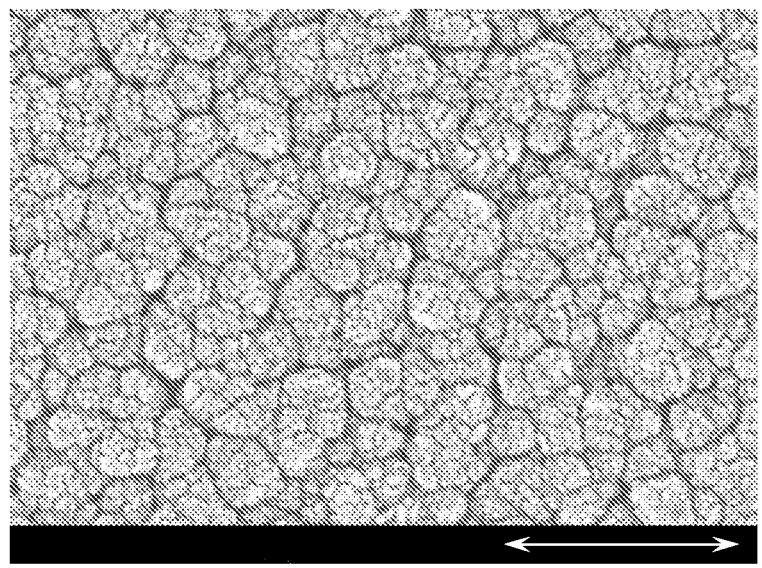
FIG. 15 is a SEM photograph of a microcrystalline silicon film.

FIG. 15 shows a scanning electron microscope (SEM) photograph (magnified 0.2 million times) of the microcrystalline semiconductor film formed as a comparative example.

The crystallinities of Sample 1, Sample 2, and the comparative example were measured by Raman spectroscopy analysis. Here, the Raman spectroscopy analysis was conducted with the use of LabRAM HR-PL manufactured by HORIBA Jobin Yvon.

The crystalline/amorphous peak intensity ratio (Ic/Ia) at three points, which are (1) the vicinity of the center of the substrate, (2) the vicinity of the edge of the substrate, and (3) the intermediate point between (1) and (2), of Sample 1 and Sample 2 is shown in Table 1.

TABLE 1

|  | (1) | (2) | (3) | Average |
| --- | --- | --- | --- | --- |
| Sample 1 | 15.91 | 15.55 | 14.69 | 15.38 |
| Sample 2 | 12.37 | 11.92 | 11.97 | 12.09 |
| Comparative example | 8.35 | 8.14 | 7.78 | 8.09 |

The Ic/Ia of the microcrystalline semiconductor films of Sample 1 and Sample 2 each exceeds 10, and thus it is found that the microcrystalline semiconductor films of Sample 1 and Sample 2 have high crystallinity as compared to the comparative example.

Accordingly, by using the formation method described in Embodiment 1, microcrystalline semiconductor films which have high crystallinity and in which mixed phase grains are densely included were able to be formed.

Example 2

In this example, electrical characteristics of thin film transistors which are formed according to Embodiment 2 will be described.

A method for forming a thin film transistor of this example will be described with reference to FIGS. 3A to 3E and FIGS. 5A to 5C. In this example, a single-gate thin film transistor and a dual-gate thin film transistor were manufactured.

A base insulating film (not illustrated here) was formed over the substrate 101, and the gate electrode 103 was formed over the base insulating film.

Here, a glass substrate (EAGLE XG manufactured by Corning Incorporated) was used as the substrate 101.

The gate electrode 103 had a structure in which an aluminum layer was sandwiched between titanium layers. Specifically, first, a 50-nm-thick first titanium film was formed over the base insulating film by sputtering a titanium target with argon ions. At this time, the flow rate of argon which was introduced into a process chamber was 20 sccm, the pressure in the process chamber was 0.1 Pa, the applied voltage was 12 kW, and the temperature was room temperature. Then, a 100-nm-thick aluminum film was formed thereover by sputtering an aluminum target with argon ions. At this time, the flow rate of argon which was introduced into the process chamber was 50 sccm, the pressure in the process chamber was 0.4 Pa, the applied voltage was 4 kW, and the temperature was room temperature. Furthermore, a 50-nm-thick second titanium film was formed thereover by sputtering a titanium target with argon ions. The second titanium film was formed by a method similar to that of the first titanium film. In other words, the flow rate of argon which was introduced into the process chamber was 20 sccm, the pressure in the process chamber was 0.1 Pa, the applied voltage was 12 kW, and the temperature was room temperature.

After that, a resist was applied over the second titanium film, irradiated with light using a first photomask, and developed to form a mask formed of a resist.

Next, etching was performed using the mask formed of a resist, whereby the gate electrode 103 was formed. Here, two-step etching was conducted with the use of an inductively coupled plasma (ICP) apparatus in the following manner. The first etching was performed under a condition where the ICP power was 600 W, the bias power was 250 W, boron trichloride and chlorine were introduced at flow rates of 60 sccm and 20 sccm, respectively, as etching gas, and the pressure in a process chamber was 1.2 Pa. After that, the second etching was performed under a condition where the ICP power was 500 W, the bias power was 50 W, the pressure was 2.0 Pa, carbon tetrafluoride was introduced at a flow rate of 80 sccm as an etching gas, and the pressure in the process chamber was 2.0 Pa. After that, the mask formed of a resist was removed.

Next, the gate insulating film 105 was formed over the gate electrode 103 and the base insulating film. Then, plasma treatment was performed on the gate insulating film 105.

In this example, a 300-nm-thick silicon nitride film was formed by a plasma CVD method as the gate insulating film 105, and plasma treatment was performed. In the deposition for the silicon nitride oxide film, silane, hydrogen, nitrogen, and ammonia were introduced as source gas at flow rates of 15 sccm, 200 sccm, 180 sccm, and 500 sccm, respectively; the pressure in a process chamber was 100 Pa; the RF power source frequency was 13.56 MHz; the power of the RF power source was 200 W; and plasma discharge was performed. Note that in the deposition for the gate insulating film 105, a parallel-plate plasma treatment apparatus was used, the temperature of an upper electrode was 250° C., the temperature of a lower electrode was 290° C., and the distance (the gap) between the upper electrode and the lower electrode was 30 mm.

The plasma treatment on the formed silicon nitride film was performed in the following manner: dinitrogen monoxide was introduced into a process chamber at a flow rate of 400 sccm, the pressure in the process chamber was 60 Pa, the power was 300 W, and the plasma discharge was performed for three minutes. Note that in the plasma treatment, a parallel-plate plasma treatment apparatus was used, the temperature of an upper electrode was 250° C., the temperature of a lower electrode was 290° C., the distance (the gap) between the upper electrode and the lower electrode was 30 mm.

Then, the seed crystal 107 with a thickness of 5 nm was formed by a plasma CVD method over the gate insulating film 105. A deposition condition similar to that of the seed crystal described in Example 1 was employed for the deposition of the seed crystal 107 here.

The structure obtained through the process up to here is illustrated in FIG. 3A.

Then, the first microcrystalline semiconductor film 109 having a thickness of 25 nm was formed over the gate insulating film 105 and the seed crystal 107 by a plasma CVD method. A deposition condition similar to that of the first microcrystalline semiconductor film described in Example 1 was employed for the deposition of the first microcrystalline semiconductor film 109 here.

The structure obtained through the process up to here is illustrated in FIG. 3B.

Next, the second microcrystalline semiconductor film 110 with a thickness of 40 nm was formed over the first microcrystalline semiconductor film 109 by a plasma CVD method. The deposition conditions other than the flow rate of silane for the second microcrystalline semiconductor film 110 are similar to those for the first microcrystalline semiconductor film 109, and a period in which silane flows at a flow rate of 1 sccm for 10 seconds and a period in which silane flows at a flow rate of 0.1 sccm for 5 seconds were repeated.

The structure obtained through the process up to here is illustrated in FIG. 3C.

Then, the semiconductor film 111 having a thickness of 80 nm was formed over the second microcrystalline semiconductor film 110, and the impurity semiconductor film 113 having a thickness of 50 nm was formed over the semiconductor film 111. The semiconductor film 111 and the impurity semiconductor film 113 were formed by deposition by a plasma CVD method.

In the deposition for the semiconductor film 111, silane, 1000 ppm ammonia (diluted with hydrogen), hydrogen, and argon were introduced as source gas at flow rates of 20 sccm, 50 sccm, 700 sccm, and 750 sccm, respectively; the pressure in a process chamber was 350 Pa; the RF power source frequency was 13.56 MHz; the power of the RF power source was 60 W; and plasma discharge was performed. Note that in the deposition for the semiconductor film 111, a parallel-plate plasma treatment apparatus was used, the temperature of an upper electrode was 250° C., the temperature of a lower electrode was 290° C., and the distance between the upper electrode and the lower electrode was 25 mm.

As the impurity semiconductor film 113, an amorphous silicon film to which phosphorus was added was formed. In the deposition for the impurity semiconductor film 113, silane, 5% phosphine (diluted with hydrogen), and hydrogen were introduced as source gas at flow rates of 80 sccm, 150 sccm, and 750 sccm, respectively; the pressure in a process chamber was 350 Pa; the RF power source frequency was 13.56 MHz; the power of the RF power source was 30 W; and plasma discharge was performed. Note that in the deposition for the impurity semiconductor film, a parallel-plate plasma treatment apparatus was used, the temperature of an upper electrode was 250° C., the temperature of a lower electrode was 290° C., and the distance between the upper electrode and the lower electrode was 15 mm.

After that, a resist was applied over the impurity semiconductor film 113, irradiated with light using a second photomask, and developed to form the mask 115 formed of a resist. The structure obtained through the process up to here is illustrated in FIG. 3D.

Then, the first microcrystalline semiconductor film 109, the second microcrystalline semiconductor film 110, the semiconductor film 111, and the impurity semiconductor film 113 were etched using the mask 115 formed of a resist, whereby the semiconductor stacked body 117 including the microcrystalline semiconductor region 117a and the amorphous semiconductor region 117b, and the impurity semiconductor film 121 were formed.

In this example, the etching was performed with an ICP apparatus under the following condition: the ICP power was 450 W; the bias power was 100 W; boron trichloride, carbon tetrafluoride, and oxygen were introduced as etching gas at flow rates of 36 sccm, 36 sccm, and 8 sccm, respectively; and the pressure in a process chamber was 2 Pa.

Then, oxygen plasma treatment was performed, whereby an oxide film was formed on side surfaces of the impurity semiconductor film 121 and the semiconductor stacked body 117 including the microcrystalline semiconductor region 117a and the amorphous semiconductor region 117b. After that, the mask 115 formed of a resist was removed (not illustrated).

In the oxygen plasma treatment, oxygen was introduced at a flow rate of 100 sccm, the pressure in a process chamber was 0.67 Pa, the substrate temperature was −10° C., the source power was 2000 W, the bias power was 350 W, and plasma discharge was performed.

Figure 3E:
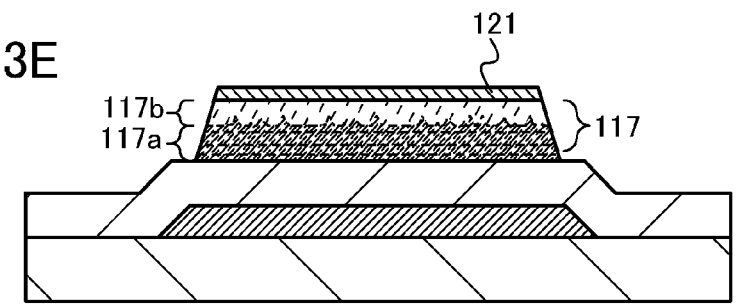

The structure obtained through the process up to here is illustrated in FIG. 3E.

Next, the conductive film 127 was formed to cover the gate insulating film 105, the semiconductor stacked body 117, and the impurity semiconductor film 121. The structure obtained by this step is illustrated in FIG. 5A.

In this example, the conductive film 127 had a structure in which an aluminum layer was sandwiched between titanium layers and was formed in a manner similar to that of the gate electrode 103. Note that the thicknesses of the first titanium film, the aluminum film, and the second titanium film were 50 nm, 200 nm, and 50 nm, respectively.

After that, a resist was applied over the conductive film 127, irradiated with light using a third photomask, and developed to form a mask formed of a resist. Dry etching was performed on the conductive film 127 using the mask formed of a resist, whereby the wirings 129a and 129b were formed. In addition, the impurity semiconductor film 121 was dry etched to form the pair of impurity semiconductor films 131a and 131b which serve as the source and drain regions. In addition, part of the semiconductor stacked body 117 was etched. After that, the resist mask was removed.

In this step, the etching was performed with an ICP apparatus under the following condition: the ICP power was 450 W; the bias power was 100 W; boron trichloride and chlorine were introduced as etching gas at flow rates of 60 sccm and 20 sccm, respectively; and the pressure in a process chamber was 1.9 Pa. By the etching step, a region of the semiconductor stacked body 117, which ranges from the surface to a depth of 60 nm to 80 nm, was etched.

Further, the partly etched semiconductor stacked body 117 was further etched, so that the semiconductor stacked body 133 including the microcrystalline semiconductor region 133a and the pair of amorphous semiconductor regions 133b were formed.

In this step, etching was performed under the following condition: the source power was 1000 W; the bias power was 50 W; carbon tetrafluoride was introduced as an etching gas at a flow rate of 100 sccm; and the pressure in a process chamber was 0.67 Pa.

Note that the etching was performed to a depth of 20 nm from the surface of the partly etched semiconductor stacked body 117. In this example, the wirings 129a and 129b serving as a source electrode and a drain electrode had a straight line shape in a plane view.

Then, the surface of the semiconductor stacked body 133 was subjected to water plasma treatment, whereby impurities remaining on the surface of the semiconductor stacked body 133 were removed. In this step, the water plasma treatment was performed under the following condition: the power was 1800 W; water vapor was introduced at a flow rate of 300 sccm; and the pressure in a process chamber was 66.5 Pa.

The structure obtained through the process up to here is illustrated in FIG. 5B.

Next, a 300-nm-thick silicon nitride film was formed as the insulating film 137. In the deposition for the insulating film 137, silane, ammonia, nitrogen, and hydrogen were introduced as source gas at flow rates of 20 sccm, 220 sccm, 450 sccm, and 450 sccm, respectively; the pressure in a process chamber was 160 Pa; the RF power source frequency was 27 MHz; the power of the RF power source was 200 W; and plasma discharge was performed. Note that in the deposition for the insulating film 137, a parallel-plate plasma treatment apparatus was used, the temperature of an upper electrode was 250° C., the temperature of a lower electrode was 290° C., and the distance between the upper electrode and the lower electrode was 21 mm.

After that, a resist was applied over the insulating film 137, irradiated with light using a fourth photomask, and developed to form a mask formed of a resist. Using the mask formed of a resist, part of the insulating film was dry-etched to expose the wirings 129a and 129b serving as the source and drain electrodes. In addition, part of the insulating film 137 and part of the gate insulating film 105 were dry-etched to expose the gate electrode 103. After that, the mask formed of a resist was removed.

Next, a conductive film was formed over the insulating film 137. Then, a resist was applied over the conductive film, irradiated with light using a fifth photomask, and developed to form a resist mask. For the single-gate thin film transistor, part of the conductive film was wet-etched using the resist mask, so that a conductive film connected to the wiring 129a, a conductive film connected to the wiring 129b, and a conductive film connected to the gate electrode 103 were formed. For the dual-gate thin film transistor, part of the conductive film was wet-etched using the resist mask, so that a conductive film connected to the wiring 129a, a conductive film connected to the wiring 129b, the back gate electrode 139 connected to the gate electrode 103 were formed. Note that the conductive film functions as a pad used at the time of measuring electrical characteristics of the thin film transistor.

In this example, as the conductive film, a 50-nm-thick indium tin oxide was formed by a sputtering method and then was wet-etched to form the back gate electrode 139. Although not illustrated, the back gate electrode 139 was connected to the gate electrode 103. After that, the mask formed of a resist was removed.

Through the above-described process, a dual-gate thin film transistor was manufactured (see FIG. 5C).

Figure 14A:
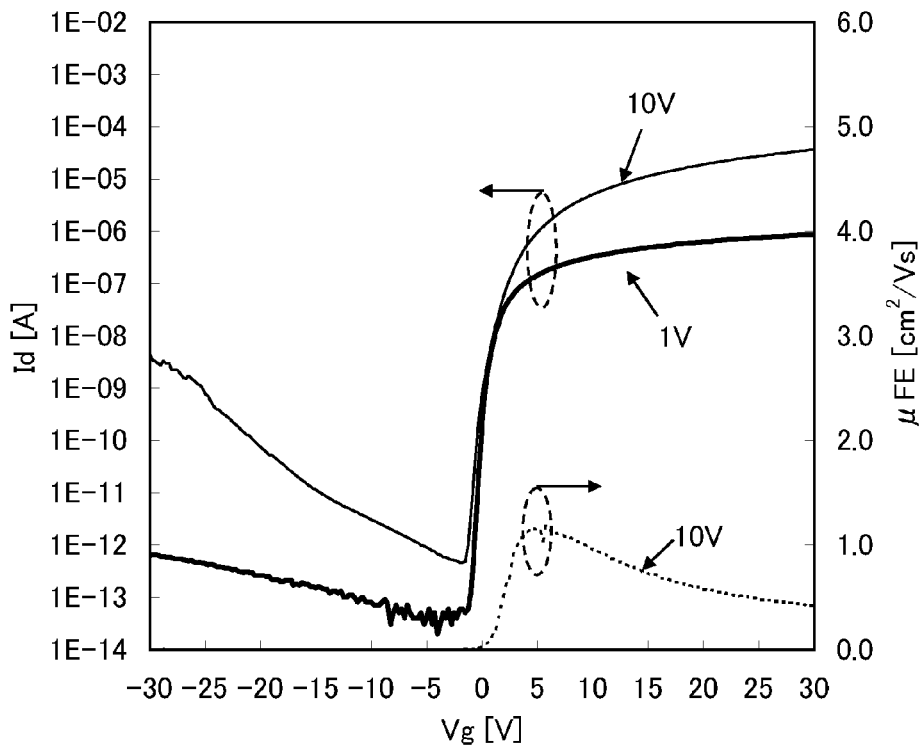
FIGS. 14A and 14B are graphs showing current-voltage characteristics of thin film transistors.
Figure 14B:
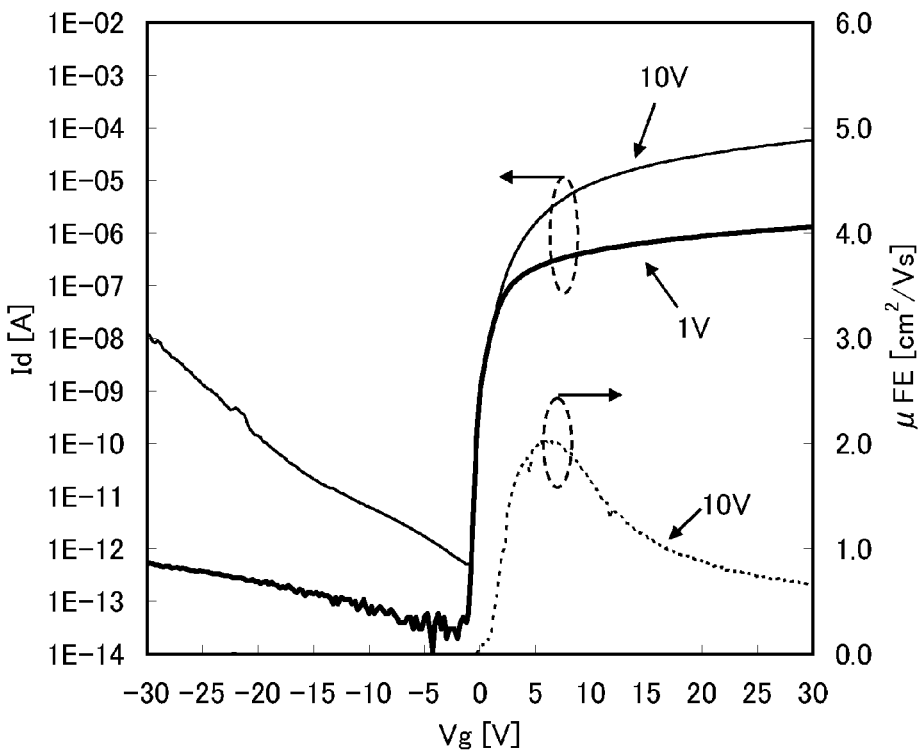

FIGS. 14A and 14B show measurement results of electrical characteristics of the thin film transistors manufactured in this example. FIG. 14A shows the measurement results of electrical characteristics of the single-gate thin film transistor (referred to as a s-gate TFT), while FIG. 14B shows the measurement results of electrical characteristics of the dual-gate thin film transistor (referred to as a d-gate TFT). The gate voltage was applied to the gate electrode 103 of the single-gate thin film transistor. Further, the voltage was applied to the gate electrode 103 and the back gate electrode 139 of the dual-gate thin film transistor. Note that in the thin film transistors of this example, the distance between facing portions of the wirings 129a and 129b was set to be 3.3 μm, the width of the facing portions of the wirings 129a and 129b was set to be 20.2 μm, and the width of the semiconductor stacked body 133 in a channel width direction was set to be 22.2 μm. Further, the field-effect mobility was calculated using the following values: the channel width was 20.2 μm, which was the width of the facing portions of the wirings 129a and 129b; the channel length was 3.3 μm, which was the distance between the facing portions of the wirings 129a and 129b; the thickness of the gate insulating film 105 was 300 nm; and the average permittivity was 6.61.

Further, Table 2 shows the on-state current (denoted by $I_{on}$) at a drain voltage of 10 V and a gate voltage of 15 V, the minimum off-state current (denoted by $I_{off}$(min.)), the off-state current (denoted by $I_{off}$) at a gate voltage that is 10 V lower than the gate voltage at the minimum off-state current, the threshold voltage (denoted by $V_{th}$), the S value (denoted by S-value), the ratio of the on-state current to the minimum off-state current (denoted by $I_{on}/I_{off}$(min.)), and the field-effect mobility at a drain voltage of 10 V (denoted by μFE_sat.), and the ratio of the field-effect mobility of the dual-gate thin film transistor to that of the single-gate thin film transistor (denoted by μFE(Dual)/μFE(Single)).

TABLE 2

|  |  | s-gate TFT | d-gate TFT |
|---|---|---|---|
| Ion | [μA] | 11.12 | 18.60 |
| Ioff(min.) | [pA] | 0.46 | 0.51 |
| Ioff | [pA] | 4.64 | 7.49 |
| Vth | [V] | 1.35 | 1.42 |
| S-value | [V/dec.] | 0.36 | 0.20 |

TABLE 2-continued

|  |  | s-gate TFT | d-gate TFT |
|---|---|---|---|
| Ion/Ioff(min.) | [Digit] | 7.38 | 7.56 |
| μFE_sat. | [cm²/Vs] | 1.17 | 2.01 |
| μFE(Dual)/μFE(Single) |  | — | 1.73 times |

As shown in FIGS. 14A and 14B, thin film transistors having excellent electrical characteristics were able to be manufactured by using a microcrystalline semiconductor film formed by the method which includes three steps of forming the seed crystal and then sequentially forming the first microcrystalline semiconductor film and the second microcrystalline semiconductor film and in which at least the first microcrystalline semiconductor film and the second microcrystalline semiconductor film were formed at high pressure.

This application is based on Japanese Patent Application serial no. 2010-188688 filed with Japan Patent Office on Aug. 25, 2010, the entire contents of which are hereby incorporated by reference.

What is claimed is:

1. A manufacturing method of a microcrystalline semiconductor film, comprising:
    forming a seed crystal that includes mixed phase grains with a space provided between the mixed phase grains over an insulating film;
    forming a first microcrystalline semiconductor film over the seed crystal, so that the mixed phase grains grow to fill the space provided between the mixed phase grains by a plasma CVD method under a first condition in which a deposition gas comprising silicon is diluted by setting a flow rate of hydrogen to more than or equal to 100 times and less than or equal to 2000 times that of the deposition gas and the pressure in the process chamber is higher than or equal to 1333 Pa and lower than or equal to 13332 Pa; and
    forming a second microcrystalline semiconductor film over the first microcrystalline semiconductor film so as not to increase the space provided between the mixed phase grains included in the first microcrystalline semiconductor film by a plasma CVD method under a second condition in which hydrogen and a deposition gas comprising silicon are supplied to the process chamber in a state of alternately increasing and decreasing a flow rate ratio of the deposition gas to hydrogen and the pressure in the process chamber is higher than or equal to 1333 Pa and lower than or equal to 13332 Pa.

2. A manufacturing method of a microcrystalline semiconductor film, comprising:
    forming a seed crystal over an insulating film by a plasma CVD method under a first condition in which a deposition gas comprising silicon is diluted by setting a flow rate of hydrogen to more than or equal to 50 times and less than or equal to 1000 times that of the deposition gas and a pressure in a process chamber is higher than or equal to 67 Pa and lower than or equal to 13332 Pa;
    forming a first microcrystalline semiconductor film over the seed crystal by a plasma CVD method under a second condition in which a deposition gas comprising silicon is diluted by setting a flow rate of hydrogen to more than or equal to 100 times and less than or equal to 2000 times that of the deposition gas and the pressure in the process chamber is higher than or equal to 1333 Pa and lower than or equal to 13332 Pa; and forming a second microcrystalline semiconductor film over the first microcrystalline semiconductor film by a plasma CVD method under a third condition in which hydrogen and a deposition gas comprising silicon are supplied to the process chamber in a state of alternately increasing and decreasing a flow rate ratio of the deposition gas to hydrogen and the pressure in the process chamber is higher than or equal to 1333 Pa and lower than or equal to 13332 Pa.

3. The manufacturing method of a microcrystalline semiconductor film according to claim 2, wherein the seed crystal comprises a grain including both an amorphous region and a crystallite.

4. The manufacturing method of a semiconductor device by using the manufacturing method of the microcrystalline semiconductor film according to claim 2.

5. A manufacturing method of a semiconductor device, comprising:
    forming a gate electrode over a substrate;
    forming a gate insulating film over the substrate and the gate electrode;
    forming a seed crystal over the gate insulating film under a first condition;
    forming a first microcrystalline semiconductor film over the seed crystal under a second condition;
    forming a second microcrystalline semiconductor film over the first microcrystalline semiconductor film under a third condition;
    forming a semiconductor film including a microcrystalline semiconductor region and an amorphous semiconductor region over the second microcrystalline semiconductor film;
    forming a first impurity semiconductor film over the semiconductor film;
    forming an island-shaped second impurity semiconductor film by etching a part of the first impurity semiconductor film;
    forming an island-shaped first semiconductor stacked body by etching a part of the seed crystal, a part of the first microcrystalline semiconductor film, a part of the second microcrystalline semiconductor film, and a part of the semiconductor film;
    forming a wiring functioning as a source electrode and a drain electrode over the island-shaped second impurity semiconductor film; and
    forming a pair of impurity semiconductor films functioning as a source region and a drain region by etching the island-shaped second impurity semiconductor film,
    wherein the first condition is a condition in which a deposition gas containing silicon is diluted by setting a flow rate of hydrogen to more than or equal to 50 times and less than or equal to 1000 times that of the deposition gas and a pressure in a process chamber is higher than or equal to 67 Pa and lower than or equal to 13332 Pa,
    wherein the second condition is a condition in which a deposition gas containing silicon is diluted by setting a flow rate of hydrogen to more than or equal to 100 times and less than or equal to 2000 times that of the deposition gas and the pressure in the process chamber is higher than or equal to 1333 Pa and lower than or equal to 13332 Pa, and
    wherein the third condition is a condition in which hydrogen and a deposition gas containing silicon are supplied to the process chamber in a state of alternately increasing and decreasing a flow rate ratio of the deposition gas to hydrogen and the pressure in the process chamber is higher than or equal to 1333 Pa and lower than or equal to 13332 Pa.

6. The manufacturing method of a semiconductor device according to claim 5, wherein after formation of the island-shaped first semiconductor stacked body and before formation of the wiring, a side surface of the island-shaped first semiconductor stacked body is exposed to plasma to form a barrier region on the side surface of the island-shaped first semiconductor stacked body.

7. The manufacturing method of a semiconductor device according to claim 5, further comprising:
    etching a part of the island-shaped first semiconductor stacked body to form a second semiconductor stacked body in which a microcrystalline semiconductor region and a pair of amorphous semiconductor regions are stacked,
    forming an insulating film over the wiring, the pair of impurity semiconductor films, the second semiconductor stacked body, and the gate insulating film, and
    forming a back gate electrode and a pixel electrode over the insulating film.

8. The manufacturing method of a semiconductor device according to claim 7, wherein the gate electrode and the back gate electrode are substantially parallel to each other.

9. The manufacturing method of a semiconductor device according to claim 7, wherein the gate electrode and the back gate electrode are connected to each other.

10. The manufacturing method of a semiconductor device according to claim 7, wherein the back gate electrode is in a floating state.

11. The manufacturing method of a semiconductor device according to claim 7, wherein the back gate electrode and the pixel electrode are formed at the same time.

12. The manufacturing method of a microcrystalline semiconductor film according to claim 1,
    wherein the microcrystalline semiconductor film is formed over a glass substrate, a ceramic substrate, or a plastic substrate.

13. The manufacturing method of a microcrystalline semiconductor film according to claim 2,
    wherein the microcrystalline semiconductor film is formed over a glass substrate, a ceramic substrate, or a plastic substrate.

14. The manufacturing method of a microcrystalline semiconductor film according to claim 1,
    wherein the seed crystal is formed over the insulating film by a plasma CVD method under a third condition in which a deposition gas comprising silicon is diluted by setting a flow rate of hydrogen to more than or equal to 50 times and less than or equal to 1000 times that of the deposition gas and a pressure in a process chamber is higher than or equal to 67 Pa and lower than or equal to 13332 Pa.

15. The manufacturing method of a microcrystalline semiconductor film according to claim 14,
    wherein the seed crystal is formed at a temperature of 150° C. to 280° C.

16. The manufacturing method of a microcrystalline semiconductor film according to claim 2,
    wherein the seed crystal is formed at a temperature of 150° C. to 280° C.

17. The manufacturing method of a microcrystalline semiconductor film according to claim 14,
    wherein the deposition gas comprises at least one of helium, neon, argon, krypton, and xenon.

18. The manufacturing method of a microcrystalline semiconductor film according to claim 2,
  wherein the deposition gas comprises at least one of helium, neon, argon, krypton, and xenon.

19. The manufacturing method of a microcrystalline semiconductor film according to claim 1,
  wherein the total thickness of the first microcrystalline semiconductor film and the second microcrystalline semiconductor film is greater than or equal to 30 nm and less than or equal to 100 nm.

20. The manufacturing method of a microcrystalline semiconductor film according to claim 2,
  wherein the total thickness of the first microcrystalline semiconductor film and the second microcrystalline semiconductor film is greater than or equal to 30 nm and less than or equal to 100 nm.

* * * * *